(12) United States Patent
Mutlu et al.

(10) Patent No.: US 11,243,068 B1
(45) Date of Patent: Feb. 8, 2022

(54) CONFIGURATION AND OPERATION OF ARRAY OF SELF-MIXING INTERFEROMETRY SENSORS

(71) Applicant: Apple Inc., Cupertino, CA (US)

(72) Inventors: Mehmet Mutlu, Stanford, CA (US); Mark T. Winkler, San Jose, CA (US); Tong Chen, Cupertino, CA (US); Omid Momtahan, Palo Alto, CA (US)

(73) Assignee: Apple Inc., Cupertino, CA (US)

( * ) Notice: Subject to any disclaimer, the term of this patent is extended or adjusted under 35 U.S.C. 154(b) by 39 days.

(21) Appl. No.: 16/773,827

(22) Filed: Jan. 27, 2020

Related U.S. Application Data

(60) Provisional application No. 62/812,196, filed on Feb. 28, 2019.

(51) Int. Cl.
| | | |
|---|---|---|
| *G01B 9/02* | (2006.01) | |
| *H01S 5/14* | (2006.01) | |
| *H01S 5/06* | (2006.01) | |
| *H01S 5/026* | (2006.01) | |
| *G01S 7/4912* | (2020.01) | |

(52) U.S. Cl.
CPC ........ *G01B 9/02092* (2013.01); *G01S 7/4916* (2013.01); *H01S 5/0264* (2013.01); *H01S 5/0607* (2013.01); *H01S 5/14* (2013.01)

(58) Field of Classification Search
CPC ..... G01B 9/02092; H01S 5/14; H01S 5/0607; H01S 5/0264; G01S 7/4916
See application file for complete search history.

(56) References Cited

U.S. PATENT DOCUMENTS

| | | |
|---|---|---|
| 4,254,333 A | 3/1981 | Bergström |
| 4,468,131 A | 8/1984 | Bui et al. |
| 6,233,045 B1 | 5/2001 | Suni et al. |
| (Continued) | | |

FOREIGN PATENT DOCUMENTS

| | | |
|---|---|---|
| CN | 102109650 | 6/2011 |
| CN | 108225543 | 6/2018 |
| (Continued) | | |

OTHER PUBLICATIONS

U.S. Appl. No. 17/124,132, filed Dec. 16, 2020, Chen et al.
(Continued)

*Primary Examiner* — Michael P LaPage
(74) *Attorney, Agent, or Firm* — Brownstein Hyatt Farber Schreck, LLP

(57) ABSTRACT

A sensor system includes a self-mixing interferometry sensor; a drive circuit configured to apply a modulated drive signal to an input of the self-mixing interferometry sensor; a mixer circuit configured to mix a modulated output of the self-mixing interferometry sensor with a local oscillator signal that is orthogonal to the modulated drive signal over a period of time; an integrator circuit configured to integrate an output of the mixer circuit over the period of time; and a processor configured to determine, using an output of the integrator circuit, at least one of a round-trip propagation time of electromagnetic radiation emitted by the self-mixing interferometry sensor and reflected back into the self-mixing interferometry sensor by an object or medium, or a velocity of the object or medium.

20 Claims, 18 Drawing Sheets

(56) References Cited

U.S. PATENT DOCUMENTS

| | | | |
|---|---|---|---|
| 6,816,523 B1 | 11/2004 | Glenn et al. | |
| 6,872,931 B2 | 3/2005 | Liess et al. | |
| 7,277,180 B2 | 10/2007 | Townley-Smith et al. | |
| 7,388,672 B2 | 6/2008 | Zhou et al. | |
| 7,509,050 B2 | 3/2009 | Ekkizogloy et al. | |
| 7,620,332 B2 | 11/2009 | Nishiyama | |
| 7,675,020 B2 | 3/2010 | Machida | |
| 7,995,193 B2 | 8/2011 | Kuwata | |
| 8,208,814 B2 | 6/2012 | Sheth et al. | |
| 8,446,592 B1* | 5/2013 | Arissian | G01B 9/02003 356/484 |
| 8,529,460 B2 | 9/2013 | Kawano et al. | |
| 8,736,581 B2 | 5/2014 | Han et al. | |
| 8,896,745 B2 | 11/2014 | Takachi | |
| 8,942,069 B2 | 1/2015 | Tortora | |
| 9,004,698 B2 | 4/2015 | Kilcher et al. | |
| 9,091,573 B2 | 7/2015 | Van Der Lee et al. | |
| 9,648,221 B2 | 5/2017 | Seo et al. | |
| 9,912,923 B2 | 3/2018 | Kilcher et al. | |
| 10,184,783 B2 | 1/2019 | Flanders et al. | |
| 10,215,555 B2 | 2/2019 | Chen et al. | |
| 10,317,651 B2 | 6/2019 | Furutake et al. | |
| 10,379,028 B2 | 8/2019 | Spruit et al. | |
| 10,386,554 B2 | 8/2019 | Hjelmstrom et al. | |
| 10,492,679 B2 | 12/2019 | Zhou | |
| 10,503,048 B2 | 12/2019 | Del Bino et al. | |
| 10,613,625 B2 | 4/2020 | Huang et al. | |
| 10,614,295 B2 | 4/2020 | Kim et al. | |
| 10,635,800 B2 | 4/2020 | Bakish | |
| 10,791,283 B2 | 9/2020 | Bardagjy et al. | |
| 10,845,873 B2 | 11/2020 | Huang | |
| 2005/0156874 A1 | 7/2005 | Kong | |
| 2005/0157971 A1* | 7/2005 | Juijve | G06F 1/1683 385/12 |
| 2005/0243053 A1* | 11/2005 | Liess | G06F 3/0421 345/156 |
| 2006/0239312 A1* | 10/2006 | Kewitsch | H01S 5/42 372/29.023 |
| 2009/0002829 A1 | 1/2009 | Shinohara | |
| 2011/0126617 A1 | 6/2011 | Bengoechea Apezteguia et al. | |
| 2011/0267467 A1 | 11/2011 | Kimura et al. | |
| 2012/0281221 A1 | 11/2012 | Studer et al. | |
| 2013/0088647 A1* | 4/2013 | Zhou | H04L 25/061 348/731 |
| 2014/0293055 A1 | 10/2014 | Otsuka | |
| 2016/0003862 A1* | 1/2016 | Ueno | G01S 17/58 356/28 |
| 2016/0021285 A1 | 1/2016 | Nadler et al. | |
| 2016/0320173 A1* | 11/2016 | Royo Royo | G01S 17/32 |
| 2017/0090599 A1 | 3/2017 | Kuboyama et al. | |
| 2017/0192133 A1 | 7/2017 | Murakami et al. | |
| 2017/0351049 A1 | 12/2017 | Yong et al. | |
| 2017/0374261 A1 | 12/2017 | Teich et al. | |
| 2018/0081434 A1 | 3/2018 | Siddiqui et al. | |
| 2018/0132043 A1 | 5/2018 | Bakish | |
| 2019/0090068 A1 | 3/2019 | Fishman et al. | |
| 2019/0317454 A1 | 10/2019 | Holenarsipur et al. | |
| 2019/0391539 A1 | 12/2019 | Perkins et al. | |
| 2020/0072740 A1 | 3/2020 | Venturini et al. | |
| 2020/0103274 A1 | 4/2020 | Garrett et al. | |
| 2020/0200522 A1 | 6/2020 | Huang et al. | |
| 2020/0309661 A1 | 10/2020 | Spruit et al. | |
| 2020/0356159 A1 | 11/2020 | Mutlu et al. | |
| 2020/0370879 A1 | 11/2020 | Mutlu et al. | |
| 2021/0015350 A1 | 1/2021 | Butte et al. | |

FOREIGN PATENT DOCUMENTS

| | | |
|---|---|---|
| WO | WO 05/013517 | 2/2005 |
| WO | WO 09/156937 | 12/2009 |
| WO | WO 17/178711 | 10/2017 |
| WO | WO 18/036685 | 3/2018 |
| WO | WO 19/042953 | 3/2019 |

OTHER PUBLICATIONS

U.S. Appl. No. 17/167,218, filed Feb. 4, 2021, Shou et al.
U.S. Appl. No. 16/827,646, filed Mar. 23, 2020, Li et al.
U.S. Appl. No. 16/849,826, filed Apr. 15, 2020, Mutlu et al.
U.S. Appl. No. 16/230,967, filed Dec. 21, 2018, Huang et al.
U.S. Appl. No. 16/408,295, filed May 9, 2019, Mutlu et al.
U.S. Appl. No. 16/418,875, filed May 21, 2019, Chen et al.

* cited by examiner

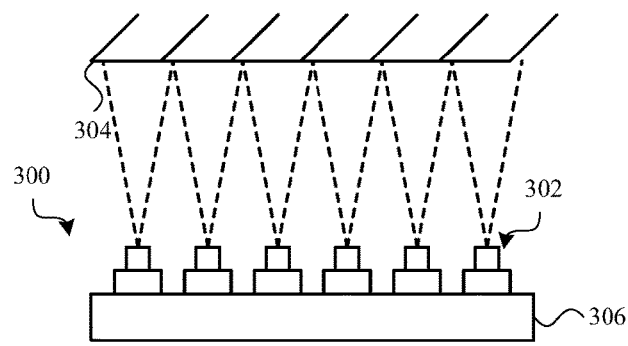
FIG. 3
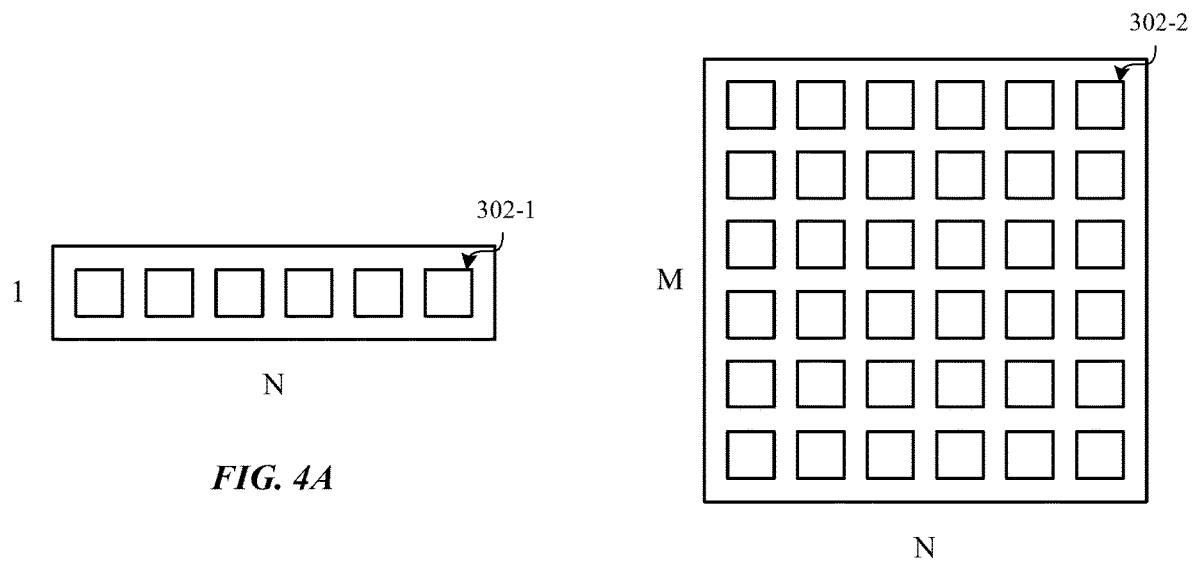
FIG. 4A
FIG. 4B

CONFIGURATION AND OPERATION OF ARRAY OF SELF-MIXING INTERFEROMETRY SENSORS

CROSS-REFERENCE TO RELATED APPLICATION

This application is a nonprovisional of and claims the benefit under 35 U.S.C. § 119(e) of U.S. Provisional Patent Application No. 62/812,196, filed Feb. 28, 2019, the contents of which are incorporated herein by reference as if fully disclosed herein.

FIELD

The described embodiments relate generally to self-mixing interferometry sensors. More particularly, the described embodiments relate to the configuration and operation of an array of self-mixing interferometry sensors.

BACKGROUND

Sensor systems are included in many of today's electronic devices, including electronic devices such as smartphones, computers (e.g., tablet computers or laptop computers), wearable electronic devices (e.g., electronic watches or health monitors), game controllers, navigation systems (e.g., vehicle navigation systems or robot navigation systems), and so on. Sensor systems may variously sense the presence of objects, distances to objects or proximities of objects, movements of objects (e.g., whether objects are moving, or the speed, acceleration, or direction of movement of objects), two-dimensional (2D) boundaries of objects, three-dimensional (3D) shapes of objects, qualities of objects (e.g., particulate matter concentration, air quality, or object density), and so on. Sensor systems may also determine object types (or make educated guesses of object type based on pattern or parameter matching, machine learning, artificial intelligence (AI), and so on).

Given the wide range of sensor system applications, any new development in the configuration or operation of a sensor system can be useful. New developments that may be particularly useful are developments that reduce the cost, size, complexity, part count, or manufacture time of the sensor system, or developments that improve the sensitivity or speed of sensor system operation.

SUMMARY

Embodiments of the systems, devices, methods, and apparatus described in the present disclosure are directed to the configuration and operation of an array of self-mixing interferometry sensors. A self-mixing interferometry sensor is defined herein as a sensor configured to generate electromagnetic radiation, emit the electromagnetic radiation from a resonant optical cavity, receive a reflection of the electromagnetic radiation (e.g., electromagnetic radiation reflected from an object or medium) back into the resonant optical cavity, self-mix the generated and reflected electromagnetic radiation within the resonant optical cavity, and produce an output indicative of the self-mixing. The generated, emitted, and received electromagnetic radiation may be coherent or partially coherent. In some examples, the electromagnetic radiation emitted by a self-mixing interferometry sensor may be generated by an electromagnetic radiation source such as a vertical-cavity surface-emitting laser (VCSEL), a vertical external-cavity surface-emitting laser (VECSEL), a quantum-dot laser (QDL), a quantum cascade laser (QCL), or a light-emitting diode (LED) (e.g., an organic LED (OLED), a resonant-cavity LED (RC-LED), a micro LED (mLED), a superluminescent LED (SLED), or an edge-emitting LED), and so on. The generated, emitted, and received electromagnetic radiation may include, for example, visible or invisible light (e.g., green light, infrared (IR) light, ultraviolet (UV) light, and so on). The output of a self-mixing interferometry sensor may include a photocurrent produced by a photodetector (e.g., a photodiode) that is integrated with, or positioned under or next to, the sensor's electromagnetic radiation source. Alternatively or additionally, the output of a self-mixing interferometry sensor may include a measurement of the sensor's bias current or junction voltage. An array of self-mixing interferometry sensors may be a one-dimensional (1D) array (i.e., a 1×N array, with N≥2) or a 2D array (i.e., an M×N array, with M and N≥2).

As described herein, a 1D or 2D array of self-mixing interferometry sensors may be configured as a bio-authentication or facial recognition sensor, a depth mapping sensor, a presence sensor, a gesture sensor, a speech recognition sensor, a proximity sensor, a heart-rate and/or respiration-rate sensor, a blood pressure sensor, and so on. In some embodiments, sinusoidally-modulated drive signals may be applied to inputs of different self-mixing interferometry sensors in an array. In some embodiments, a modulated output of a self-mixing interferometry sensor may be mixed with a local oscillator signal that is orthogonal to the modulated drive signals over a period of time, and an output of the mixing may be integrated over the period of time to provide a DC signal that is proportional to a velocity of an object or medium that reflects emitted electromagnetic radiation back into the self-mixing interferometry sensor. In this manner, the velocity of the object or medium, a distance to the object or medium, and/or other parameters may be determined without having to perform a spectral analysis (e.g., a fast Fourier transform (FFT)) on an output of the self-mixing interferometry sensor. This may greatly reduce the processing burden and improve time-to-measurement(s) for an array comprising many self-mixing interferometry sensors.

In a first aspect, the present disclosure describes a sensor system. The sensor system may include a self-mixing interferometry sensor; a drive circuit configured to apply a modulated drive signal to an input of the self-mixing interferometry sensor; a mixer circuit configured to mix a modulated output of the self-mixing interferometry sensor with a local oscillator signal that is orthogonal to the modulated drive signal over a period of time; and an integrator circuit configured to integrate an output of the mixer circuit over the period of time.

In another aspect, the present disclosure describes a sensor system including a set of one or more self-mixing interferometry sensors, and a set of one or more lenses defining a set of multiple electromagnetic radiation emission regions. The set of one or more self-mixing interferometry sensors may output a set of sinusoidally-modulated electromagnetic radiation waveforms. The set of one or more lenses may direct different electromagnetic radiation waveforms into different electromagnetic radiation emission regions.

In still another aspect of the disclosure, a method of mapping a field of view is described. The method may include applying orthogonally-modulated drive signals to an array of self-mixing interferometry sensors, and emitting into the field of view from the array of self-mixing interferometry sensors, in response to the orthogonally-modulated drive signals, a set of orthogonally-modulated electromagnetic radiation waveforms. The method may also include, for each self-mixing interferometry sensor, mixing a modulated output of the self-mixing interferometry sensor with a local oscillator signal that is orthogonal to the modulated drive signal over a period of time, and integrating a result of the mixing over the period of time. The method may further include generating, in response to the integrations performed for the array of self-mixing interferometry sensors, at least one of a depth map or a velocity map for the field of view.

In addition to the exemplary aspects and embodiments described above, further aspects and embodiments will become apparent by reference to the drawings and by study of the following description.

BRIEF DESCRIPTION OF THE DRAWINGS

The disclosure will be readily understood by the following detailed description in conjunction with the accompanying drawings, wherein like reference numerals designate like structural elements, and in which:

FIG. 3 shows a first example elevation of a sensor system that may be included in a device;

FIGS. 4A and 4B show alternative plan views of the array of self-mixing interferometry sensors described with reference to FIG. 3;

Figure 1A:
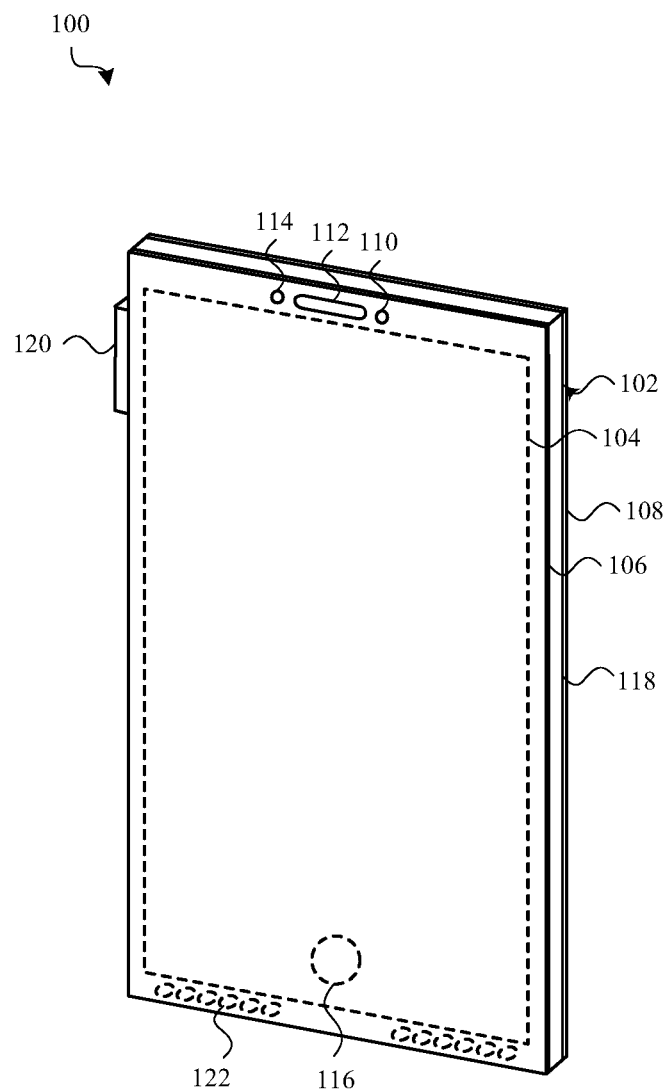
FIGS. 1A and 1B show a first example of a device that may include a sensor system.

The use of cross-hatching or shading in the accompanying figures is generally provided to clarify the boundaries between adjacent elements and also to facilitate legibility of the figures. Accordingly, neither the presence nor the absence of cross-hatching or shading conveys or indicates any preference or requirement for particular materials, material properties, element proportions, element dimensions, commonalities of similarly illustrated elements, or any other characteristic, attribute, or property for any element illustrated in the accompanying figures.

Additionally, it should be understood that the proportions and dimensions (either relative or absolute) of the various features and elements (and collections and groupings thereof) and the boundaries, separations, and positional relationships presented therebetween, are provided in the accompanying figures merely to facilitate an understanding of the various embodiments described herein and, accordingly, may not necessarily be presented or illustrated to scale, and are not intended to indicate any preference or requirement for an illustrated embodiment to the exclusion of embodiments described with reference thereto.

DETAILED DESCRIPTION

Reference will now be made in detail to representative embodiments illustrated in the accompanying drawings. It should be understood that the following description is not intended to limit the embodiments to one preferred embodiment. To the contrary, it is intended to cover alternatives, modifications, and equivalents as can be included within the spirit and scope of the described embodiments as defined by the appended claims.

The following description relates to the configuration and operation of arrays of self-mixing interferometry (SMI) sensors. Arrays of self-mixing interferometry sensors may be used in lieu of imaging or time-of-flight (ToF) sensors, or for other purposes, and can sometimes reduce time-to-measurement in comparison to imaging or ToF sensors. In some cases, the reduced time-to-measurement may be a result of not having to compare two image or data capture frames to identify or quantify movements of an object or medium (or changes in a field of view (FoV)). In other words, an array of self-mixing interferometry sensors can generate a velocity map, for objects or mediums within a FoV, using data obtained in a single data capture frame, owing to the Doppler effect. In some cases, the reduced time-to-measurement may be a result of the computation and processing techniques described herein.

Arrays of self-mixing interferometry sensors can also provide better resolution and range than many cameras or image sensors. Their velocity resolution benefits from the fact that an observed Doppler shift is proportional to the frequency of emitted electromagnetic radiation. For example, for near-infrared light at 300 THz, distance resolution benefits from the availability of large frequency modulation (e.g., modulation at 100 GHz) of the electromagnetic radiation emitted from a semiconductor radiation source.

Because ambient light, such as sunlight, is temporally and spatially incoherent with the coherent electromagnetic radiation emitted by an array of self-mixing interferometry sensors, a sensor system including an array of self-mixing interferometry sensors will not produce self-mixing interference signals at the relevant frequency range of the self-mixing interferometry sensors.

These and other embodiments and advantages are discussed with reference to FIGS. 1A-14. However, those skilled in the art will readily appreciate that the detailed description given herein with respect to these figures is for explanatory purposes only and should not be construed as limiting.

Directional terminology, such as "top", "bottom", "upper", "lower", "front", "back", "over", "under", "above", "below", "left", "right", etc. is used with reference to the orientation of some of the components in some of the figures described below. Because components in various embodiments can be positioned in a number of different orientations, directional terminology is used for purposes of illustration only and is in no way limiting. The directional terminology is intended to be construed broadly, and therefore should not be interpreted to preclude components being oriented in different ways. The use of alternative terminology, such as "or", is intended to indicate different combinations of the alternative elements. For example, A or B is intended to include A, or B, or A and B.

Figure 1B:
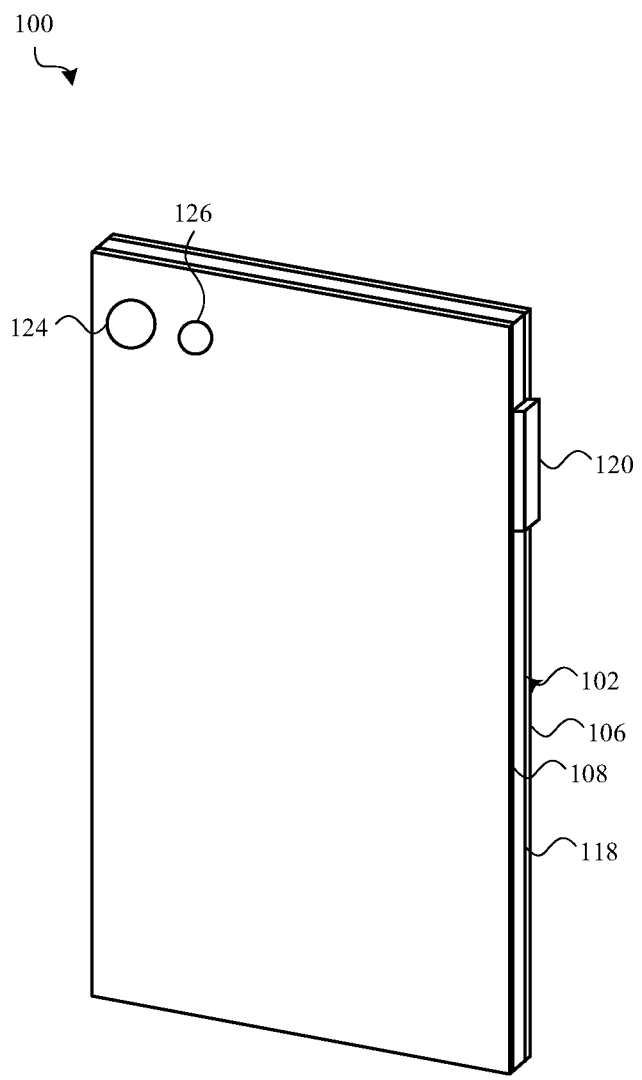

FIGS. 1A and 1B show a first example of a device 100 that may include a sensor system. The device's dimensions and form factor, including the ratio of the length of its long sides to the length of its short sides, suggest that the device 100 is a mobile phone (e.g., a smartphone). However, the device's dimensions and form factor are arbitrarily chosen, and the device 100 could alternatively be any portable electronic device including, for example a mobile phone, tablet computer, portable computer, portable music player, health monitor device, portable terminal, vehicle navigation system, robot navigation system, or other portable or mobile device. The device 100 could also be a device that is semi-permanently located (or installed) at a single location. FIG. 1A shows a front isometric view of the device 100, and FIG. 1B shows a rear isometric view of the device 100. The device 100 may include a housing 102 that at least partially surrounds a display 104. The housing 102 may include or support a front cover 106 or a rear cover 108. The front cover 106 may be positioned over the display 104, and may provide a window through which the display 104 may be viewed. In some embodiments, the display 104 may be attached to (or abut) the housing 102 and/or the front cover 106. In alternative embodiments of the device 100, the display 104 may not be included and/or the housing 102 may have an alternative configuration.

The display 104 may include one or more light-emitting elements including, for example, an LED, OLED, liquid crystal display (LCD), electroluminescent (EL) display, or other type of display element. In some embodiments, the display 104 may include, or be associated with, one or more touch and/or force sensors that are configured to detect a touch and/or a force applied to a surface of the front cover 106.

The various components of the housing 102 may be formed from the same or different materials. For example, the sidewall 118 may be formed using one or more metals (e.g., stainless steel), polymers (e.g., plastics), ceramics, or composites (e.g., carbon fiber). In some cases, the sidewall 118 may be a multi-segment sidewall including a set of antennas. The antennas may form structural components of the sidewall 118. The antennas may be structurally coupled (to one another or to other components) and electrically isolated (from each other or from other components) by one or more non-conductive segments of the sidewall 118. The front cover 106 may be formed, for example, using one or more of glass, a crystal (e.g., sapphire), or a transparent polymer (e.g., plastic) that enables a user to view the display 104 through the front cover 106. In some cases, a portion of the front cover 106 (e.g., a perimeter portion of the front cover 106) may be coated with an opaque ink to obscure components included within the housing 102. The rear cover 108 may be formed using the same material(s) that are used to form the sidewall 118 or the front cover 106. In some cases, the rear cover 108 may be part of a monolithic element that also forms the sidewall 118 (or in cases where the sidewall 118 is a multi-segment sidewall, those portions of the sidewall 118 that are non-conductive). In still other embodiments, all of the exterior components of the housing 102 may be formed from a transparent material, and components within the device 100 may or may not be obscured by an opaque ink or opaque structure within the housing 102.

The front cover 106 may be mounted to the sidewall 118 to cover an opening defined by the sidewall 118 (i.e., an opening into an interior volume in which various electronic components of the device 100, including the display 104, may be positioned). The front cover 106 may be mounted to the sidewall 118 using fasteners, adhesives, seals, gaskets, or other components.

A display stack or device stack (hereafter referred to as a "stack") including the display 104 may be attached (or abutted) to an interior surface of the front cover 106 and extend into the interior volume of the device 100. In some cases, the stack may include a touch sensor (e.g., a grid of capacitive, resistive, strain-based, ultrasonic, or other type of touch sensing elements), or other layers of optical, mechanical, electrical, or other types of components. In some cases, the touch sensor (or part of a touch sensor system) may be configured to detect a touch applied to an outer surface of the front cover 106 (e.g., to a display surface of the device 100).

In some cases, a force sensor (or part of a force sensor system) may be positioned within the interior volume below and/or to the side of the display 104 (and in some cases within the device stack). The force sensor (or force sensor system) may be triggered in response to the touch sensor detecting one or more touches on the front cover 106 (or a location or locations of one or more touches on the front cover 106), and may determine an amount of force associated with each touch, or an amount of force associated with the collection of touches as a whole.

As shown primarily in FIG. 1A, the device 100 may include various other components. For example, the front of the device 100 may include one or more front-facing cameras 110, speakers 112, microphones, or other components 114 (e.g., audio, imaging, and/or sensing components) that are configured to transmit or receive signals to/from the device 100. In some cases, a front-facing camera 110, alone or in combination with other sensors, may be configured to operate as a bio-authentication or facial recognition sensor. The device 100 may also include various input devices, including a mechanical or virtual button 116, which may be accessible from the front surface (or display surface) of the device 100. In some cases, the front-facing camera 110, virtual button 116, and/or other sensors of the device 100 may be integrated with a display stack of the display 104 and moved under the display 104.

The device 100 may also include buttons or other input devices positioned along the sidewall 118 and/or on a rear surface of the device 100. For example, a volume button or multipurpose button 120 may be positioned along the sidewall 118, and in some cases may extend through an aperture in the sidewall 118. The sidewall 118 may include one or more ports 122 that allow air, but not liquids, to flow into and out of the device 100. In some embodiments, one or more sensors may be positioned in or near the port(s) 122. For example, an ambient pressure sensor, ambient temperature sensor, internal/external differential pressure sensor, gas sensor, particulate matter concentration sensor, or air quality sensor may be positioned in or near a port 122.

In some embodiments, the rear surface of the device 100 may include a rear-facing camera 124 or other optical sensor (see FIG. 1B). A flash or light source 126 may also be positioned along the rear of the device 100 (e.g., near the rear-facing camera). In some cases, the rear surface of the device 100 may include multiple rear-facing cameras.

The camera(s), microphone(s), pressure sensor(s), temperature sensor(s), biometric sensor(s), button(s), proximity sensor(s), touch sensor(s), force sensor(s), particulate matter or air quality sensor(s), and so on of the device 100 may form parts of various sensor systems. In some cases, a sensor system may perform best with a wide FoV or increased granularity (i.e., with a sensing field that includes multiple sensors). In these cases, a sensor system may include an array of sensors (e.g., a 1D or 2D array of sensors). For example, a bio-authentication sensor system may include a 2D array of sensors that emit and receive electromagnetic radiation (e.g., IR light). As another example, a presence-sensing sensor system may include a 1D or 2D array of sensors that emit and receive electromagnetic radiation.

Figure 2A:
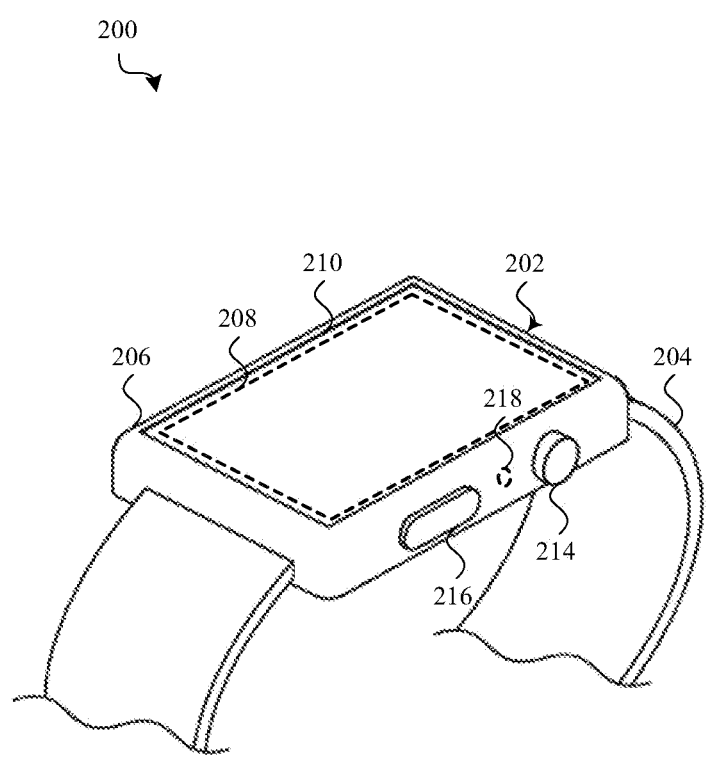
FIGS. 2A and 2B show a second example of a device that may include a sensor system.
Figure 2B:
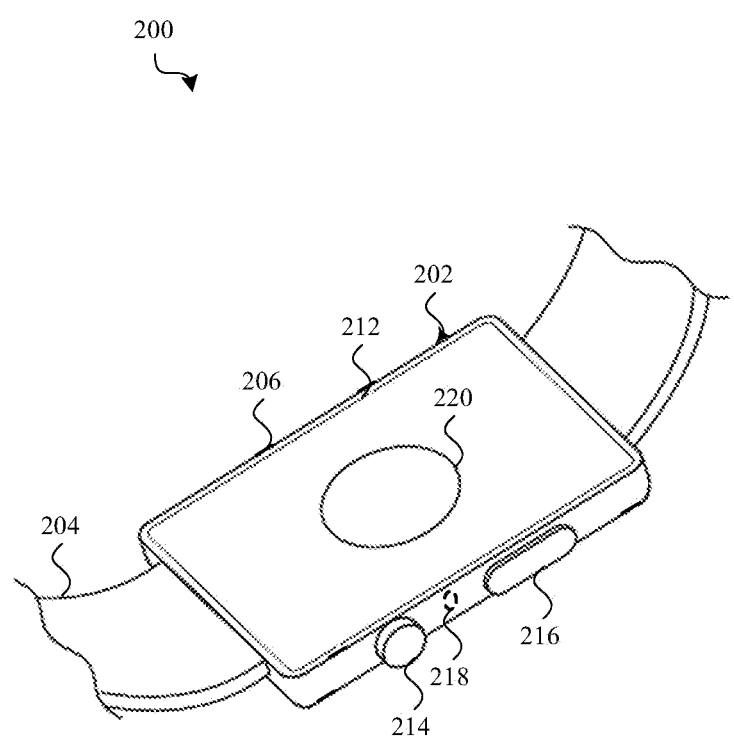

FIGS. 2A and 2B show a second example of a device 200 that may include a sensor system. The device's dimensions and form factor, and inclusion of a band 204, suggest that the device 200 is an electronic watch. However, the device 200 could alternatively be any wearable electronic device. FIG. 2A shows a front isometric view of the device 200, and FIG. 2B shows a rear isometric view of the device 200. The device 200 may include a body 202 (e.g., a watch body) and a band 204. The watch body 202 may include an input or selection device, such as a crown 214 or a button 216. The band 204 may be used to attach the body 202 to a body part (e.g., an arm, wrist, leg, ankle, or waist) of a user. The body 202 may include a housing 206 that at least partially surrounds a display 208. The housing 206 may include or support a front cover 210 (FIG. 2A) or a rear cover 212 (FIG. 2B). The front cover 210 may be positioned over the display 208, and may provide a window through which the display 208 may be viewed. In some embodiments, the display 208 may be attached to (or abut) the housing 206 and/or the front cover 210. In alternative embodiments of the device 200, the display 208 may not be included and/or the housing 206 may have an alternative configuration.

The housing 206 may in some cases be similar to the housing 102 described with reference to FIGS. 1A-1B, and the display 208 may in some cases be similar to the display 104 described with reference to FIGS. 1A-1B.

The device 200 may include various sensor systems, and in some embodiments may include some or all of the sensor systems included in the device 100 described with reference to FIGS. 1A-1B. In some embodiments, the device 200 may have a port 218 (or set of ports) on a side of the housing 206 (or elsewhere), and an ambient pressure sensor, ambient temperature sensor, internal/external differential pressure sensor, gas sensor, particulate matter concentration sensor, or air quality sensor may be positioned in or near the port(s) 218.

In some cases, the rear surface (or skin-facing surface) of the device 200 may include a flat or raised area 220 that includes one or more skin-facing sensors. For example, the area 220 may include a heart-rate monitor, a respiration-rate monitor, or a blood pressure monitor. The area 220 may also include an off-wrist detector or other sensor. Similarly to the device 100, one or more sensor systems of the device 200 may perform best with a wide FoV or increased granularity (i.e., with a sensing field that includes multiple sensors), and the sensor system may include a 1D or 2D array of sensors.

For a sensor system that is dependent on emitting and receiving electromagnetic radiation (e.g., light), the sensor system may include one or more self-mixing interferometry sensors. In some embodiments, a self-mixing interferometry sensor may include a photodetector (e.g., a photodiode) positioned near an electromagnetic radiation source such as a VCSEL, VECSEL, QDL, QCL, or LED. For example, a self-mixing interferometry sensor may include a photodetector positioned next to, under, or over an electromagnetic radiation source. In other embodiments, a self-mixing interferometry sensor may include a photodetector that is integrated with an electromagnetic radiation source. In still other embodiments, a self-mixing interferometry sensor may include an electromagnetic radiation source but no photodetector, in which case the bias current or junction voltage of the sensor may be measured to provide the sensor's interferometric output. The size or pitch of self-mixing interferometry sensors may therefore be adjusted, and in some cases made very small, enabling many self-mixing interferometry sensors to be arranged in a high-density array of self-mixing interferometry sensors. The integration of photodetectors with electromagnetic radiation sources (e.g., intra-cavity or on-chip extra-cavity), or even elimination of photodetectors, can also reduce sensor part count and cost.

In devices such as those described with reference to FIGS. 1A-1B or 2A-2B, or in other devices (e.g., a vehicle or robot navigation system), a 2D array of self-mixing interferometry sensors can be used as a sensor array in a bio-authentication sensor system. For example, a 2D array of self-mixing interferometry sensors may be used to perform depth mapping (e.g., to generate a depth map) of a user's face or finger, and the depth map may be compared to one or more depth maps associated with a previously authenticated user to determine whether the user should be granted access to a device. As another example, a 1D or 2D array of self-mixing interferometry sensors may be used to perform depth mapping and velocity mapping for an array of spatial and/or angular regions within a FoV, and a resultant depth map and velocity map may be used by a machine learning or AI application to determine whether an object or medium (sometimes referred to as a target) or particular type of object or medium (e.g., a user, user's ear, user's face, user's finger, or stylus) is present within the FoV. Such presence-sensing may be used to enable or disable particular functions of a device, or enable a navigation system to provide feedback to a vehicle, robot, or user. A depth map is defined herein as an array of device-to-object distances (or device-to-medium) distances, from which a 2D relief map or 3D model of a FoV can be generated. In lieu of distances, a depth map may include an array of information from which distances to objects or mediums can be determined. A velocity map is defined herein as an array of velocities, and in some cases directions of movement, of the objects, portions of objects, medium, or portions of mediums within an array of regions defining a FoV.

In another sensor system, a 2D array of self-mixing interferometry sensors may be used to perform depth mapping and/or velocity mapping for an array of spatial and/or angular regions within a FoV, and a resultant depth map and/or velocity map may be used to identify gestures (e.g., hand gestures) within the FoV. An array of self-mixing interferometry sensors can often detect micro-movements (e.g., micro-gestures) that are too small for a traditional camera or imaging sensor to detect. Additionally or alternatively, velocity mapping of a person's mouth, lips, cheeks, neck, and/or throat may be used to perform speech recognition, which may be used to playback, record, or transcribe what the person says. In some cases, recognized speech may be used as voice command input, and may cause a processor (e.g., a processor in a remote control device) to execute commands corresponding to the recognized speech. Recognized (or detected) speech may also be used to enhance acoustic microphone recording. For example, in some cases, detected speech can be used to identify time intervals during which the user is speaking, so that background noise can be removed by turning of the microphone when the user is not speaking. Also or alternatively, detected speech can be used to increase the integrity of speech-based authentication systems, as well as to provide added protection to replay attacks on an acoustic microphone.

A 1D or 2D array of self-mixing interferometry sensors may also be used for proximity-sensing. Proximity-sensing may be performed by depth mapping a FoV and determining whether an object or medium within the FoV is within a certain range (i.e., range of distances) from a device.

In some cases, a 1D or 2D array of self-mixing interferometry sensors may be used for heart-rate or respiration-rate sensing. For example, the array of self-mixing interferometry sensors may be used to velocity map a person's chest or wrist, or even the blood flow within a person's wrist. The periodicity of chest movement may be used to determine a person's respiration rate, whereas the periodicity of chest or wrist vibrations may be used to determine a person's heart rate. Additionally or alternatively, a 1D or 2D array of self-mixing interferometry sensors may be used to velocity map a pressure wave. When the pressure wave corresponds to blood flow in a person's finger or wrist, the velocity map may be used to determine the person's heart-rate or blood pressure, which can be further analyzed to assess a person's health or identify physical abnormalities or disease. In some cases, a velocity map of a pressure wave may be pattern matched to pressure waves representing healthy and abnormal conditions.

For a navigation system, a 1D or 2D array of self-mixing interferometry sensors may be used to depth map and/or velocity map a vehicle's, robot's, or user's surroundings (similar to a light detection and ranging (LIDAR) system) and provide navigation cues to a person, or navigation instructions to a machine, for purposes such as navigation, mapping, safety planning, and/or obstacle sensing. In some cases, an array of self-mixing interferometry sensors may be used to perform sub-millimeter navigation, owing to frequency modulation of emitted electromagnetic radiation on the order of 100 GHz.

A 2D array of self-mixing interferometry sensors may form a pixelated sensor or camera, which camera may, in some cases, contemporaneously detect a presence, distance, and/or velocity of an object or medium.

FIG. 3 shows a first example elevation of a sensor system 300 that may be included in a device. In some cases, the sensor system 300 may be included in one of the devices 100, 200 described with reference to FIG. 1A-1B or 2A-2B. The sensor system 300 may include an array 302 of self-mixing interferometry sensors that emit electromagnetic radiation into a FoV. In some cases, the FoV may include one or more objects or mediums 304, such as a person, face, finger, mouth, throat, chest, blood, vehicle, and so on. The self-mixing interferometry sensors may be individually addressable (e.g., for driving and reading the self-mixing interferometry sensors). In some embodiments, the array 302 of self-mixing interferometry sensors may be directly bonded to a silicon chip 306 that contains the relevant driving and detection circuitry for the sensor system 300, for increased compactness and ease of integration.

FIGS. 4A and 4B show alternative plan views of the array 302 described with reference to FIG. 3. FIG. 4A shows a 1×N array 302-1 of self-mixing interferometry sensors (i.e., a 1D array), in which N=6, and FIG. 4B shows an M×N array 302-2 of self-mixing interferometry sensors (i.e., a 2D array), in which M=N=6.

Figure 5A:
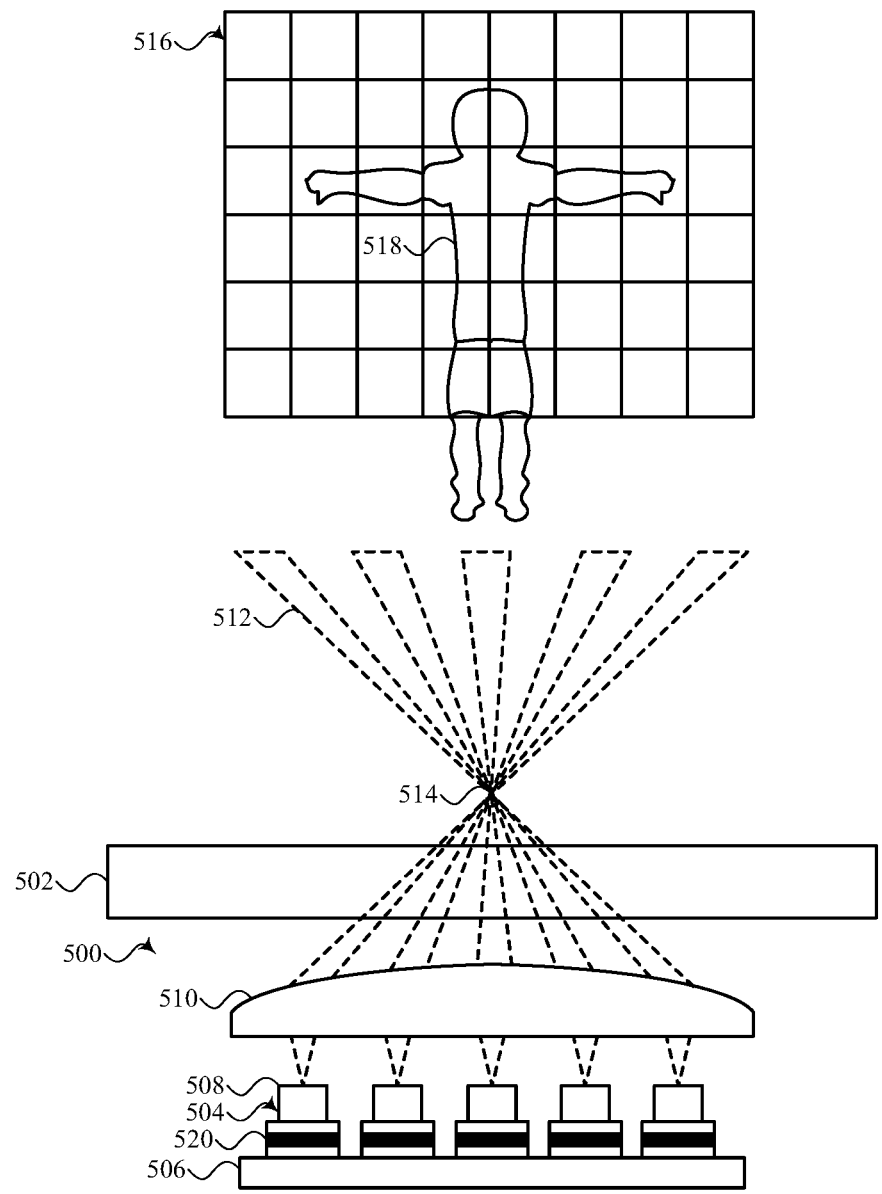
FIG. 5A shows a second example elevation of a sensor system that may be included in a device.

FIG. 5A shows a second example elevation of a sensor system 500 that may be included in a device. In some cases, the sensor system 500 may be included in one of the devices 100, 200 described with reference to FIG. 1A-1B or 2A-2B. In some cases, the sensor system 500 may be positioned under an optional cover 502 (e.g., a glass, crystal, or plastic cover).

The sensor system 500 may include a set of self-mixing interferometry sensors 504 arranged in a 1D or 2D array of self-mixing interferometry sensors 504. The self-mixing interferometry sensors 504 may be formed or mounted on a substrate 506. In some examples, the substrate 506 may be a semiconductor wafer (e.g., a gallium-arsenide (GaAs) substrate), printed circuit board (PCB), or glass or plastic substrate. The substrate 506 may include sensor addressing, driving, and TIA circuitry, and in some cases may include the circuitry described with reference to FIG. 8A or 8B. In some embodiments, this circuitry may be provided for each sensor individually.

Each self-mixing interferometry sensor 504 includes an electromagnetic radiation source 508, such as a VCSEL, VECSEL, QDL, QCL, or LED. The self-mixing interferometry sensors 504 (and more particularly, the electromagnetic radiation sources 508 of the self-mixing interferometry sensors 504) may output a set of sinusoidally-modulated electromagnetic radiation waveforms. As shown, a lens 510 may be positioned to receive the electromagnetic radiation waveforms emitted by all of the self-mixing interferometry sensors 504 and direct the electromagnetic radiation waveforms emitted by different self-mixing interferometry sensors 504 into different electromagnetic radiation emission regions 512 (e.g., the lens 510 may convert spatially-differentiated electromagnetic radiation beams to angularly-differentiated electromagnetic radiation beams). In FIG. 5A, the electromagnetic radiation emission regions 512 overlap at a focal point 514. In alternative configurations, different electromagnetic radiation emission regions 512 may overlap at the same or different points (e.g., the same or different focal points or non-focal points), or may not overlap. In some cases, the lens 510 may be a compound lens including multiple lens elements. In additional alternative configurations, the lens 510 may be replaced by a lens (or set of lenses) per self-mixing interferometry sensor 504 or subset of self-mixing interferometry sensors 504.

Electromagnetic radiation emitted by the self-mixing interferometry sensors 504 may propagate into a FoV 516 unless or until it impinges on an object or medium. By way of example, FIG. 5A shows a person 518 standing in the FoV 516. In reality, the FoV 516 and person 518 would likely be oriented planar or generally planar to the substrate 506. However, the FoV 516 and person 518 is shown rotated for ease of viewing and explanation. Electromagnetic radiation that impinges on the person 518 may reflect (from reflective portions) or scatter (from diffusive portions) toward the sensor system 500 and be received back into a resonant optical cavity of a self-mixing interferometry sensor 504 from which it was emitted. Electromagnetic radiation received back into a self-mixing interferometry sensor 504 may coherently mix with electromagnetic radiation generated by the self-mixing interferometry sensor 504, producing a self-mixing interferometry signal. The self-mixing interferometry signal may be sensed by a photodetector 520 positioned next to, under, or over a corresponding electromagnetic radiation source 508, or by a photodetector that is integrated with a corresponding electromagnetic radiation source 508. Alternatively, the self-mixing interferometry signal may be sensed by measuring a bias current or junction voltage of the electromagnetic radiation source 508.

A processor, such as the processor described with reference to FIG. 14, may be configured to generate a depth map and/or a velocity map for the different electromagnetic radiation emission regions 542. The processor may generate the depth map and/or velocity map in response to a set of modulated outputs of the self-mixing interferometry sensors 504.

In some cases, circuitry such as the circuitry described with reference to FIG. 8A or 8B may be used to apply a set of modulated drive signals to inputs of the self-mixing interferometry sensors 504 (e.g., the same modulated drive signal or different modulated drive signals may be applied to the inputs (e.g., bias current inputs) of different self-mixing interferometry sensors 504). In some cases, a same modulated drive signal may be provided to each of a plurality of self-mixing interferometry signals using a global driver circuit. The circuitry may also be used to mix the modulated output of a self-mixing interferometry sensor 504 with a local oscillator signal that is orthogonal to the modulated drive signal over a period of time, to produce a mixed signal. The circuitry may additionally be used to integrate the mixed signal over the period of time. In some cases, the circuitry (which circuitry may include a processor) may be configured to determine, using an output of the integration, at least one of a round-trip propagation time of electromagnetic radiation emitted by the self-mixing interferometry sensor 504 and reflected back into the self-mixing interferometry sensor 504 by an object or medium, or a velocity of the object or medium.

Figure 5B:
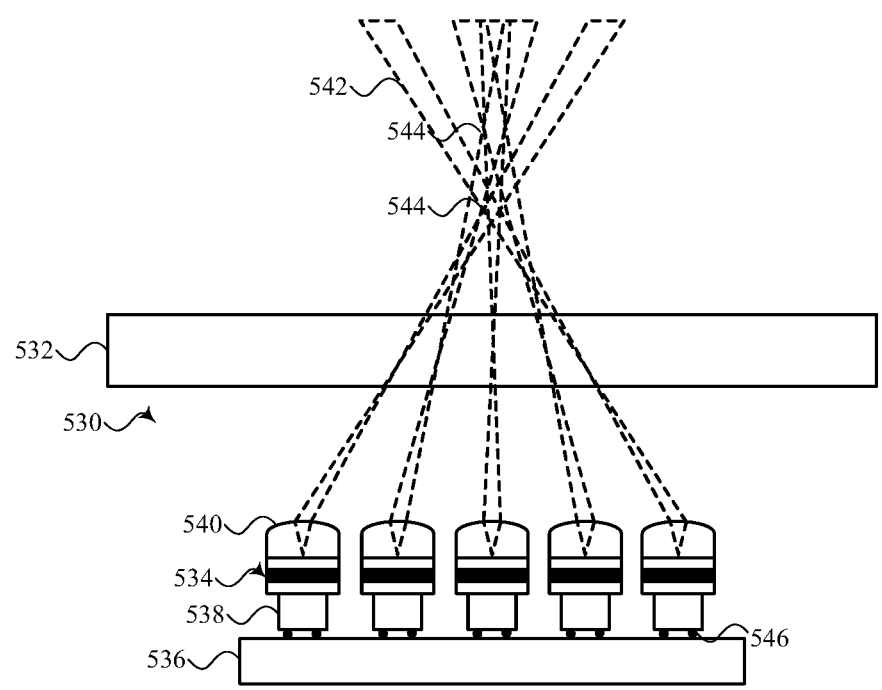
FIG. 5B shows a third example elevation of a sensor system that may be included in a device.

FIG. 5B shows a third example elevation of a sensor system 530 that may be included in a device. In some cases, the sensor system 530 may be included in one of the devices 100, 200 described with reference to FIG. 1A-1B or 2A-2B. In some cases, the sensor system 530 may be positioned under an optional cover 532 (e.g., a glass, crystal, or plastic cover).

The sensor system 530 may include a set of self-mixing interferometry sensors 534 arranged in a 1D or 2D array of self-mixing interferometry sensors 534. The self-mixing interferometry sensors 534 may be mounted on a substrate 536. In some examples, the substrate 536 may be a PCB, semiconductor wafer (e.g., a silicon wafer), or a glass or plastic substrate. The substrate 536 may include sensor addressing, driving, and TIA circuitry, and in some cases may include the circuitry described with reference to FIG. 8A or 8B. In some embodiments, this circuitry may be provided for each sensor individually.

Each self-mixing interferometry sensor 504 includes an electromagnetic radiation source 538, such as a VCSEL, VECSEL, QDL, QCL, or LED. The self-mixing interferometry sensors 534 (and more particularly, the electromagnetic radiation sources 538 of the self-mixing interferometry sensors 534) may output an electromagnetic radiation waveform. As shown, different lenses 540 may be positioned to receive electromagnetic radiation waveforms emitted by different self-mixing interferometry sensors 534, and different lenses 540 may direct the electromagnetic radiation waveforms emitted by different self-mixing interferometry sensors 534 into different electromagnetic radiation emission regions 542 (e.g., the lenses 540 may convert spatially-differentiated electromagnetic radiation beams to angularly-differentiated electromagnetic radiation beams). In FIG. 5B, different electromagnetic radiation emission regions 542 overlap at different points 544. In alternative configurations, different electromagnetic radiation emission regions 512 may overlap at the same or different points (e.g., the same or different focal points or non-focal points), or may not overlap.

In some embodiments, the lenses 540 may be formed by etching or other shaping a substrate (e.g., a GaAs substrate) on which each self-mixing interferometry sensor 534 is formed, prior or subsequent to dicing the self-mixing interferometry sensors 534 from a semiconductor wafer. In these embodiments, the self-mixing interferometry sensors 534 may include bottom-emitting electromagnetic radiation sources. As shown, the self-mixing interferometry sensors 534 may be mounted on the substrate 536 in an upside-down configuration with respect to the self-mixing interferometry sensors 504 described with reference to FIG. 5A. In some cases, the self-mixing interferometry sensors 534 may be mounted to the substrate 536 by reflowed solder balls 546 (e.g., using flip-chip bonding techniques).

Figure 5C:
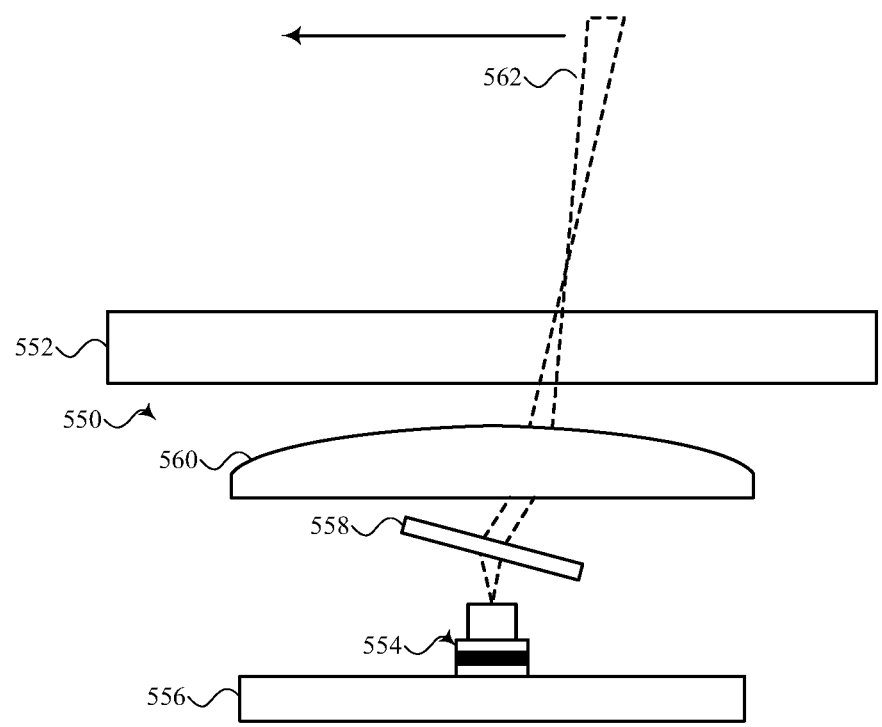
FIG. 5C shows a fourth example elevation of a sensor system that may be included in a device.

FIG. 5C shows a fourth example elevation of a sensor system 550 that may be included in a device. In some cases, the sensor system 550 may be included in one of the devices 100, 200 described with reference to FIG. 1A-1B or 2A-2B. In some cases, the sensor system 550 may be positioned under an optional cover 552 (e.g., a glass, crystal, or plastic cover).

The sensor system 550 includes only a single self-mixing interferometry sensor 554, mounted on a substrate 556, and a configurable electromagnetic radiation-directing element 558 positioned between the self-mixing interferometry sensor 554 and a lens 560. The substrate 556 may include sensor addressing, driving, and TIA circuitry, and in some cases may include the circuitry described with reference to FIG. 8A or 8B. In some embodiments, this circuitry may be provided for each sensor individually. In some examples, the configurable electromagnetic radiation-directing element 556 may include a rotating mirror or other optical element. Different configurations of the configurable electromagnetic radiation-directing element 558 (e.g., different rotations or positions) direct the electromagnetic radiation emitted by the self-mixing interferometry sensor 554 into different electromagnetic radiation emission regions 562, for a sequential illumination of different electromagnetic radiation emission regions 562. In some embodiments, the lens 560 may not be needed, or may be part of the configurable electromagnetic radiation-directing element 556.

If the electromagnetic radiation beams emitted by an array of self-mixing interferometric sensors overlap at any point within a sensing region (i.e., within a collection of electromagnetic radiation-emission regions), it is useful to ensure that there is emission frequency separation between the electromagnetic radiation beams. In some embodiments, the emission frequency separation may be at least 10 MHz. Emission frequency separation of 10 MHz enables object/medium movement detection up to ~5 m/s (meters/second) without crosstalk between self-mixing interferometry sensors. A 10 MHz difference requirement at an emission wavelength of 940 nm corresponds to a difference of ~31 parts-per-billion. In some embodiments, different self-mixing interferometry sensors within an array may have the same emission frequency, so long as the sensors emissions do not overlap within a FoV.

Figure 6A:
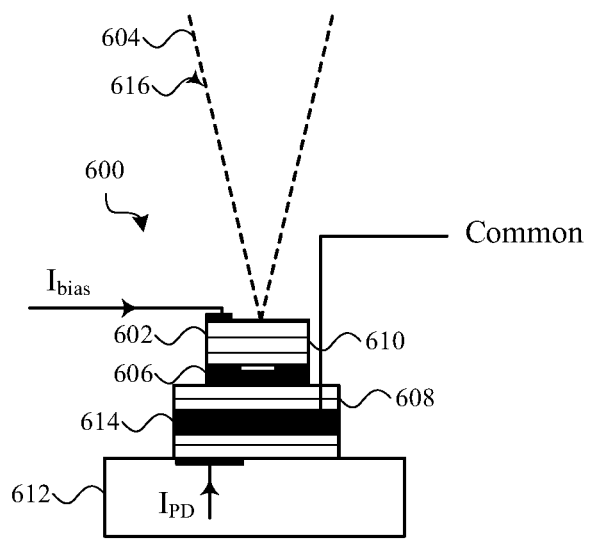
FIG. 6A shows a first embodiment of a self-mixing interferometry sensor.

FIG. 6A shows a first embodiment of a self-mixing interferometry sensor 600. The self-mixing interferometry sensor 600 is an example of the self-mixing interferometry sensors described with reference to other figures. In some cases, the self-mixing interferometry sensor 600 may be included in a sensor system of one of the devices described with reference to FIG. 1A-1B or 2A-2B.

The self-mixing interferometry sensor 600 may include an electromagnetic radiation source 602 positioned to emit a beam of electromagnetic radiation 604 (e.g., a beam of coherent or partially coherent electromagnetic radiation) into an electromagnetic emission region 616. The beam of electromagnetic radiation 604 may depend on a coherent mixing of electromagnetic radiation within the electromagnetic radiation source 602. The coherent mixing of electromagnetic radiation may include a mixing of a first amount of electromagnetic radiation generated by the electromagnetic radiation source 602, and a second amount of electromagnetic radiation redirected (e.g., reflected or scattered) from an object or medium within the electromagnetic radiation emission region 616 into the electromagnetic radiation source 602 (e.g., into a resonant optical cavity 606 of the electromagnetic radiation source 602).

The electromagnetic radiation source 602 may include a first (or bottom) mirror 608 and a second (or top) mirror 610 stacked on (e.g., formed on) a semiconductor substrate 612. The first and second mirrors 608, 610 may have reflective surfaces that face one another to form a resonant optical cavity 606 therebetween. The second mirror 610 may be partially transmissive, and may 1) allow a portion of the electromagnetic radiation generated by the electromagnetic radiation source 602 to escape the resonant optical cavity 606 as a beam of electromagnetic radiation 604, and 2) allow a portion of the electromagnetic radiation redirected (e.g., reflected or scattered) from an object or medium within the electromagnetic radiation emission region 616 to re-enter the electromagnetic radiation source 602 and coherently mix with electromagnetic radiation generated by the electromagnetic radiation source 602. In some embodiments, the second mirror's transmissivity to the wavelength of electromagnetic radiation generated/received by the electromagnetic radiation source 602 may be about 0.5%, although higher or lower transmissivities may be used. The first mirror 608 may also be partially transmissive to the wavelength of electromagnetic radiation generated/received by the self-mixing interferometry sensor 600, but in some embodiments may be less transmissive than the second mirror 610.

An intra-cavity photodetector 614 may be integrated within the first mirror 608 and may produce a photocurrent output ($I_{PD}$). Because of the mixing of generated and received electromagnetic radiation within the electromagnetic radiation source 602, the photocurrent may be a self-mixing interferometry signal. The self-mixing interferometry signal may be processed and/or analyzed to determine the presence of, distance to, velocity of, or direction of movement of an object or medium within the electromagnetic radiation emission region 616.

By way of example, the electromagnetic radiation source 602 may be a VCSEL having a top-emitting (surface-emitting) configuration. In other embodiments, the electromagnetic radiation source 602 may be a VCSEL having a bottom-emitting configuration. In a bottom-emitting configuration, a VCSEL may have optical elements etched to its bottom substrate to change the electromagnetic radiation emitted by the VCSEL. In some cases, the optical elements may be used to change the divergence of electromagnetic radiation emitted by the VCSEL. The electromagnetic radiation source 602 may alternatively be a VECSEL, QDL, QCL, LED, and so on.

The resonant optical cavity 606 may be electrically or optically pumped to generate electromagnetic radiation (e.g., light), and a gain material within the resonant optical cavity 606 may amplify the electromagnetic radiation that reflects within the resonant optical cavity 606 (e.g., the gain material may receive x photons and emit y photons, with y≥x). When pumped to generate electromagnetic radiation, a current ($I_{bias}$) may flow through the electromagnetic radiation source 602. The portion of the emitted electromagnetic radiation that is redirected from an object or medium within the electromagnetic radiation emission region 616, and that re-enters the electromagnetic radiation source 602, may be coherent or partially coherent with the electromagnetic radiation that is generated by the electromagnetic radiation source 602, and may interact (mix) with the generated electromagnetic radiation coherently. However, the electromagnetic radiation that re-enters the electromagnetic radiation source 602 may have a phase delay with respect to the electromagnetic radiation that is generated by the electromagnetic radiation source 602. The coherent mixing of generated and redirected electromagnetic radiation within the electromagnetic radiation source 602 therefore produces a self-mixing interferometry signal that modulates the beam of electromagnetic radiation 604 emitted by the electromagnetic radiation source 602. For example, the nominal power of the beam of electromagnetic radiation 604 may be one milliwatt (1 mW), but the actual power of the beam of electromagnetic radiation 604 may vary between 0.999 mW and 1.001 mW due to the coherent mixing of generated and redirected electromagnetic radiation within the electromagnetic radiation source 602. The modulation in power (or interferometry signal) carries information about the presence, movement, and/or position of an object or medium within the electromagnetic radiation emission region 616.

The afore-mentioned change in power happens as the carrier density within the electromagnetic radiation source 602 is modulated. For the same reason, the junction voltage of the electromagnetic radiation source 602 changes when it is driven with a constant bias current, or the current passing through the electromagnetic radiation source 602 changes when the electromagnetic radiation source 602 is driven with a constant voltage.

The self-mixing interferometry signal created by the coherent mixing of generated and redirected electromagnetic radiation may be measured by a sensor, such as an electrical sensor or an optoelectronic sensor. As an example, the self-mixing interferometry sensor 600 includes an optoelectronic sensor (i.e., a photodetector 614). Alternatively, the optoelectronic sensor may be replaced or supplemented by an electrical sensor (e.g., a voltage sensor) coupled to the electromagnetic radiation source 602, which may measure a junction voltage (V) of the electromagnetic radiation source 602. Measurement of the junction voltage provides an indirect measurement of the power of the beam of electromagnetic radiation 604, because the junction voltage modulates in response to the coherent mixing of electromagnetic radiation within the electromagnetic radiation source 602. Alternatively, the electrical sensor could be a current sensor that measures a current ($I_{bias}$) through the electromagnetic radiation source 602.

Figure 6B:
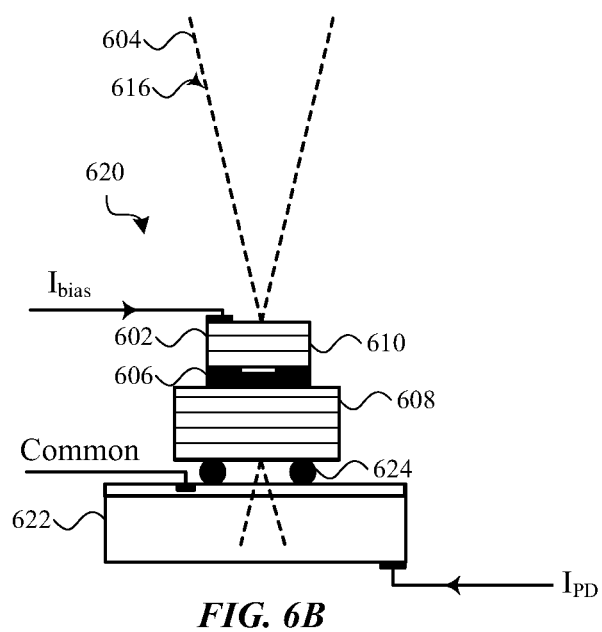
FIG. 6B shows a second embodiment of a self-mixing interferometry sensor.

FIG. 6B shows a second embodiment of a self-mixing interferometry sensor 620. The self-mixing interferometry sensor 620 is similar to the self-mixing interferometry sensor 600, but instead of having an intra-cavity photodetector integrated within the first mirror 608, it has a photodetector 622 positioned below the first mirror 608. In this embodiment, a portion of the electromagnetic radiation mixed within the electromagnetic radiation source 602 may exit through the first mirror 608 and be received by the photodetector 622. In some embodiments, the electromagnetic radiation source 602 may be stacked on the photodetector 622 and mechanically and electrically coupled to a common or ground conductor shared by the electromagnetic radiation source 602 and photodiode 622, by reflowed solder balls 624 or other mechanical and/or electrical attachment mechanisms.

Figure 7A:
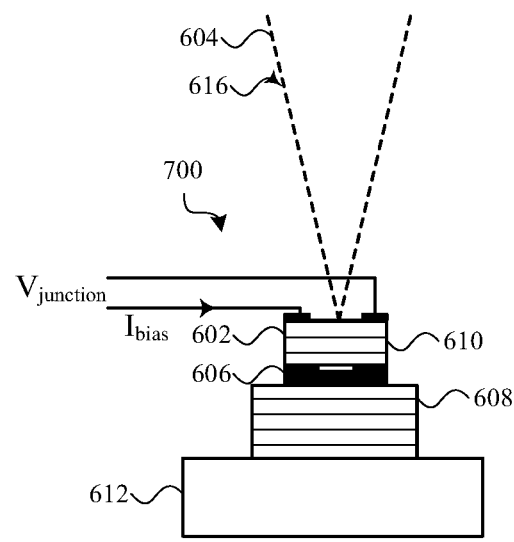
FIGS. 7A and 7B show additional embodiments of a self-mixing interferometry sensor.
Figure 7B:
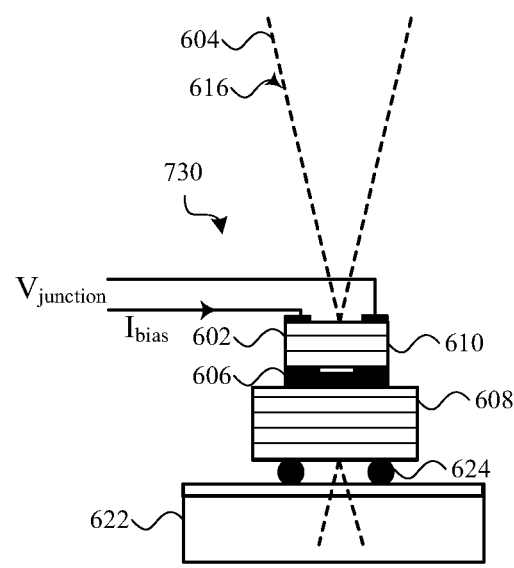

FIG. 7A shows another embodiment of a self-mixing interferometry sensor 700. The self-mixing interferometry sensor 700 is similar to the self-mixing interferometry sensor 600, but instead of having an intra-cavity photodetector integrated within the first mirror 608, it has no photodetector. Similarly, FIG. 7B shows an embodiment of a self-mixing interferometry sensor 730, which is similar to the self-mixing interferometry sensor 630, but instead of having a photodetector positioned below the first mirror 608 has no photodetector. A self-mixing interferometry signal may be acquired from either of the self-mixing interferometry sensors 700 or 730 by measuring a current ($I_{bias}$) through the electromagnetic radiation source 602, or a junction voltage ($V_{junction}$) of the electromagnetic radiation source 602.

Figure 8A:
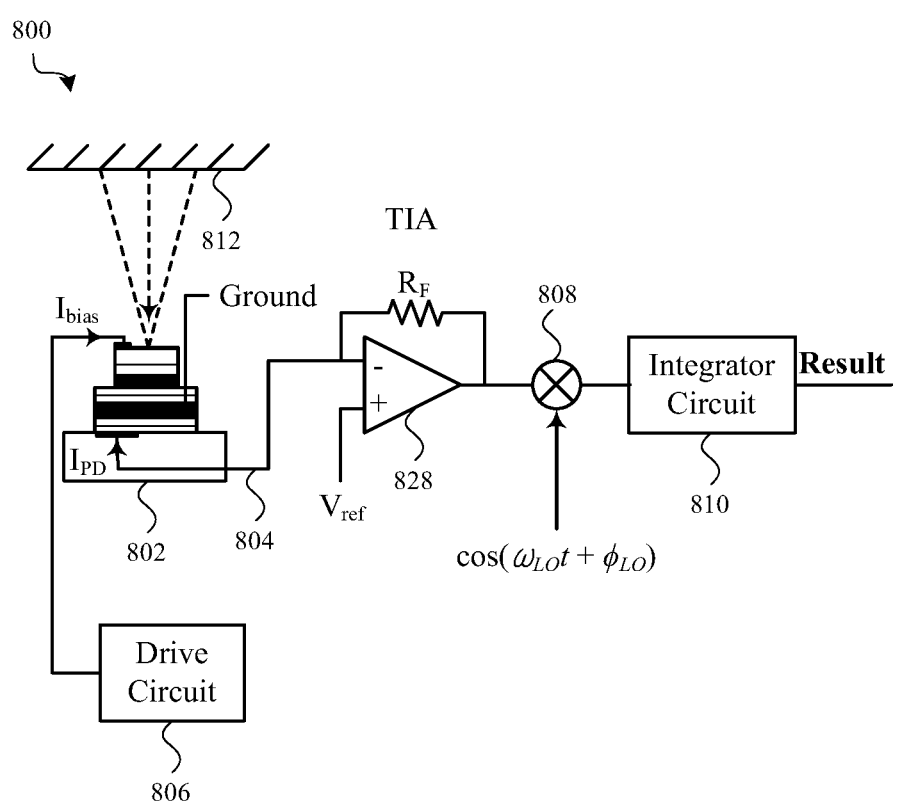
FIGS. 8A and 8B show examples of circuitry that may be used to modulate the electromagnetic radiation generated by a self-mixing interferometry sensor and evaluate a modulated output of the self-mixing interferometry sensor.

FIG. 8A shows an example of circuitry 800 that may be used to modulate the electromagnetic radiation generated by a self-mixing interferometry sensor 802 and evaluate a modulated output 804 of the self-mixing interferometry sensor 802. The evaluation may be performed without a need to perform a spectral analysis (e.g., an FFT) on the output 804. By way of example, the self-mixing interferometry sensor 802 is shown to be the self-mixing interferometry sensor described with reference to FIG. 6A. However, the self-mixing interferometry sensor 802 could alternatively take the form of any of the self-mixing interferometry sensors described herein, or other forms.

The ability to evaluate the modulated output 804 without a need to perform a spectral analysis (e.g., an FFT) can greatly reduce the processing burden of a sensor system that includes an array of self-mixing interferometry sensors, and in some cases may reduce the time-to-measurement for a sensor system. By way of example, some arrays of self-mixing interferometry sensors may include 10,000 or more self-mixing interferometry sensors.

The circuitry 800 may include a drive circuit 806, a mixer circuit 808, and an integrator circuit 810. The drive circuit 806 may be configured to apply a modulated drive signal to an input of the self-mixing interferometry sensor 802. In some embodiments, the modulated drive signal may be a sine wave, and the input of the self-mixing interferometry sensor 802 may be a bias current input. The modulated drive signal may alternatively take other forms, and the input of the self-mixing interferometry sensor 802 may alternatively be a voltage input. In some embodiments, the modulated drive signal may be a sine wave having an angular frequency of $\omega_m > 2\pi \times 30$ MHz, and a period of $2\pi/\omega_m$. In some embodiments, the initial optical angular frequency of the electromagnetic radiation emitted by the self-mixing interferometry sensor 802 may be $\omega_0 \sim 2\pi \times 353$ THz.

The mixer circuit 808 may be configured to mix a modulated output of the self-mixing interferometry sensor 802 with a sinusoidal signal generated by a local oscillator. The sinusoidal signal may have an angular frequency of $\omega_{LO}$, and a phase of $\phi_{LO}$. In some embodiments, the modulated output of the self-mixing interferometry sensor 802 may be a modulated photocurrent output from a photodetector, or a modulated bias current or junction voltage of the self-mixing interferometry sensor 802. In some embodiments, the modulated output of the self-mixing interferometry sensor 802 may be converted, filtered, or otherwise processed before being input to the mixer circuit 808. Similarly, the sinusoidal signal generated by the local oscillator may be processed in various ways.

The integrator circuit 810 may be configured to integrate an output of the mixer circuit 808 over a period of time, T. When the self-mixing interferometry sensor 802 is used in an array of self-mixing interferometry sensors, the integrator circuit 810 may be designed to be an orthogonal integrator circuit, with T and $\omega_{LO}$ being selected to satisfy orthogonality of the modulated drive signal (provided by the drive circuit 806) and the local oscillator signal, over the integration time T, which may be satisfied when the following equations are true:

$$\int_{t_i}^{t_i+\tau} \cos(\omega_m t + \phi_{md})\cos(\omega_{LO} t + \phi_{LO})dt = 0 \rightarrow T = \frac{\pi(m+n)}{\omega_m},$$

$$\omega_{LO} = \frac{\pi(n-m)}{T}$$

where $\omega_{LO}$ and $\phi_{LO}$ are the frequency and phase of the local oscillator signal, $\phi_{md}$ is the phase of the modulated drive signal, and m and n are integers that identify the design space for the integration time, T, and local oscillator frequency, $\omega_{LO}$.

A processor may be configured to determine, using the output (Result) of the integrator circuit 810, at least one of a round-trip propagation time, $\tau$, of electromagnetic radiation emitted by the self-mixing interferometry sensor 802 and reflected back into the self-mixing interferometry sensor 802 by an object or medium 812, or a velocity, v, of the object or medium 812.

Figure 8B:
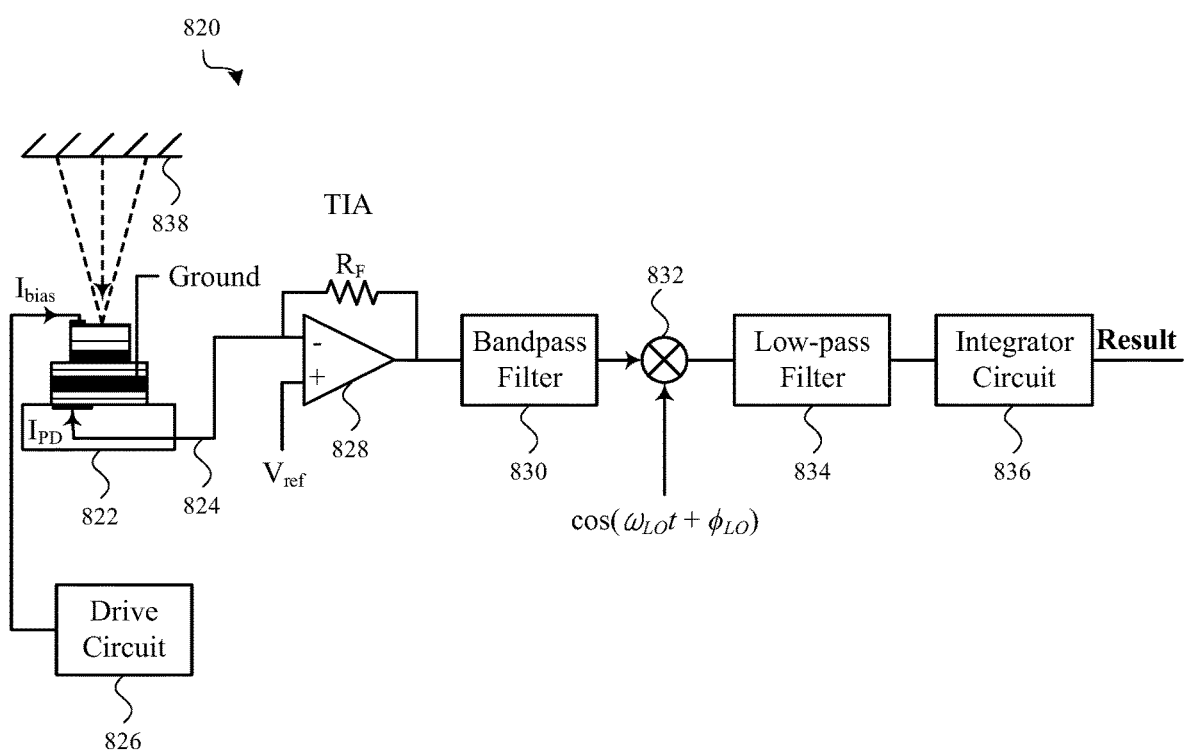

FIG. 8B shows an example of circuitry 820 that may be used to modulate the electromagnetic radiation generated by a self-mixing interferometry sensor 822 and evaluate a modulated output 824 of the self-mixing interferometry sensor 822. The circuitry 820 is a variant of the circuitry 800 described with reference to FIG. 8A.

The circuitry 820 may include a drive circuit 826, a transimpedance amplifier (TIA) 828, a bandpass filter 830, a mixer circuit 832, a low-pass filter 834, and an integrator circuit 836. The drive circuit 826 may be configured to apply a modulated drive signal to an input of the self-mixing interferometry sensor 822, as described with reference to FIG. 8A. The TIA 828 may convert a photocurrent ($I_{PD}$) output by a photodiode of the self-mixing interferometry sensor 822 to a voltage.

When a DC-bias current is applied to a laser or other self-mixing interferometry sensor, the electric field, E, emitted by the laser may be described as $E \propto \cos(\omega_0 t + \phi_0)$, with $\omega_0$ and $\phi_0$ representing the optical angular frequency (e.g., $\sim 2\pi \times 353$ THz) and phase of the electromagnetic radiation emitted by the self-mixing interferometry sensor 802. By means of sinusoidal bias current modulation, the emitted electric field changes to $E \propto \cos(\omega_m t/2) \cos(\omega_0 t - \Delta\omega \sin(\omega_m t)/\omega_m)$. The photocurrent, $I_{PD}$, produced by a photodiode or other photodetector that reads this electric field, in the absence of the electric field being reflected back into the self-mixing interferometry sensor 802 by an object or medium 838 (i.e., in the absence of self-mixing within the self-mixing interferometry sensor 802), may be described as $I_{PD} \propto |E|^2 \propto [1+\cos(\omega_m t)]$. Of note, the photodiode may not respond to frequencies near $\omega_0$.

Trigonometric identities may be used to describe the emitted electric field, E, as:

$$E \propto \cos[(\omega_0-\omega_m/2)t - \Delta\omega \sin(\omega_m t)/\omega_m + \phi_0] + \cos[(\omega_0+\omega_m/2)t - \Delta\omega \sin(\omega_m t)/\omega_m + \phi_1]$$

Bias current modulation may change the frequency of the bias current as follows:

$$\omega(t) = \omega_0 - \Delta\omega \cos(\omega_m t)$$

The Doppler-shifted electric field, $E_{fb}$, that results from emitted electromagnetic radiation reflecting off a moving object or medium may be described as:

$$E_{fb} \propto \cos[(\omega_0-\omega_m/2)(1+2v/c)t - \Delta\omega \sin(\omega_m t)/\omega_m (1+2v/c) + \phi_{jb1}] + \cos[(\omega_0+\omega_m/2)(1+2v/c)t - \Delta\omega \sin(\omega_m t)/\omega_m (1+2v/c) + \phi_{jb2}]$$

where $\phi_{jb1}$ and $\phi_{jb2}$ are the phases of the returning electromagnetic radiation and are a function of the corresponding initial phases and object distance.

The current, $I_{PD}$, produced by a photodiode or other photodetector in response to self-mixing within the self-mixing interferometry sensor 802 may be described in the case of weak optical feedback as $I_{PD} \propto |E(t+\tau)+E_{fb}(t)|^2$, where the round-trip propagation time for electromagnetic radiation emitted by the laser to reflect off of an object or medium and be received back into the laser is $\tau=2d/c$. Ignoring DC and optical frequencies, to which the photodiode cannot respond, the following six frequencies may be included in a photocurrent output by the photodiode (or in an output voltage of a TIA 828 that converts the photocurrent to a modulated voltage):

$$\omega_m,$$

$$\omega_m\left(1 + \frac{2v}{c}\right),$$

$$\frac{2v}{c}\left(\omega_0 - \frac{\omega_m}{2} - \Delta\omega\cos(\omega_m t)\right) - \Delta\omega\omega_m\tau\sin(\omega_m t),$$

$$\frac{2v}{c}\left(\omega_0 + \frac{\omega_m}{2} - \Delta\omega\cos(\omega_m t)\right) - \Delta\omega\omega_m\tau\sin(\omega_m t),$$

$$\omega_m + \frac{2v}{c}\left(\omega_0 + \frac{\omega_m}{2} - \Delta\omega\cos(\omega_m t)\right) - \Delta\omega\omega_m\tau\sin(\omega_m t),$$

$$\omega_m - \frac{2v}{c}\left(\omega_0 - \frac{\omega_m}{2} - \Delta\omega\cos(\omega_m t)\right) + \Delta\omega\omega_m\tau\sin(\omega_m t)$$

For better performance, the bandpass filter 830 may be configured to filter the modulated voltage output by the TIA 828 before the modulated voltage is provided to the mixer circuit 832. In some embodiments, the bandpass filter 830 may be configured with passband corner frequencies $\omega_{pb1}$ and $\omega_{pb2}$ as follows:

$$\omega_{pb1} = \omega_m - \frac{2v_{max}}{c}\omega_0 - \Delta\omega\omega_m\tau_{max},$$

$$\omega_{pb2} = \omega_m + \frac{2v_{max}}{c}\omega_0 + \Delta\omega\omega_m\tau_{max}$$

where $v_{max}$ is the maximum allowed (or detectable) velocity of an object, $\tau_{max}$ is the maximum roundtrip propagation time derived from a maximum allowed (or detectable) target distance, $\Delta\omega$ is the induced peak modulation of the emitted electromagnetic radiation wave, and c is the speed of light.

The bandpass filter 830 can be configured to remove DC bias, limit noise bandwidth, and remove unneeded frequencies around $2\omega_0 v/c$.

The mixer circuit 828 may shift the frequency of the modulated output signal from $\omega_m$ to $\omega_m - \omega_{LO}$.

The low-pass filter 834 may be configured to filter the output of the mixer circuit 832 before the output is provided to the integrator circuit 836. The low-pass filter 834 may eliminate higher frequencies created by the mixer circuit 832, and may have a corner frequency, $\omega_{pb3}$, of:

$$\omega_{pb3} = \omega_m - \omega_{LO} + \frac{2v_{max}}{c}\omega_0 + \Delta\omega\omega_m\tau_{max}$$

The integrator circuit 836 may be an orthogonal integrator circuit, and may remove $\omega_m - \omega_{LO}$ using orthogonality over the integration time T. Typically, $\Delta\omega \ll \omega_0$ and $\omega_m \ll \omega_0$. Also, for an integration window having a time period (or length, or integration time), T, that satisfies the equation:

$$\frac{2v_{max}}{c}\omega_m \ll \frac{2\pi}{T}$$

the output (or Result) of the orthogonal integrator circuit 836 may have the following proportionality:

$$\text{Result} \propto \frac{\sin(2v\omega_0 T/c + \Delta\omega\tau - \phi_{LO}) - \sin(\Delta\omega\tau - \phi_{LO})}{\omega_m - \omega_{LO} + 2v\omega_0/c - \Delta\omega\omega_m\tau\sin(\omega_m t)} + \frac{\sin(2v\omega_0 T/c + \Delta\omega\tau + \phi_{LO}) - \sin(\Delta\omega\tau + \phi_{LO})}{\omega_m + \omega_{LO} + 2v\omega_0/c - \Delta\omega\omega_m\tau\sin(\omega_m t)}$$

As expected, when $\Delta\omega=0$, Result does not depend on time or distance. For instance, when the local oscillator phase is zero (i.e., $\phi_{LO}=0$), the above equation can be simplified to:

$$\text{Result} \propto \sin\left(\frac{2T}{c}v\omega_0\right)\left(\frac{1}{\omega_m - \omega_{LO} + 2\omega_0 v/c} + \frac{1}{\omega_m + \omega_{LO} + 2\omega_0 v/c}\right)$$

Figure 9:
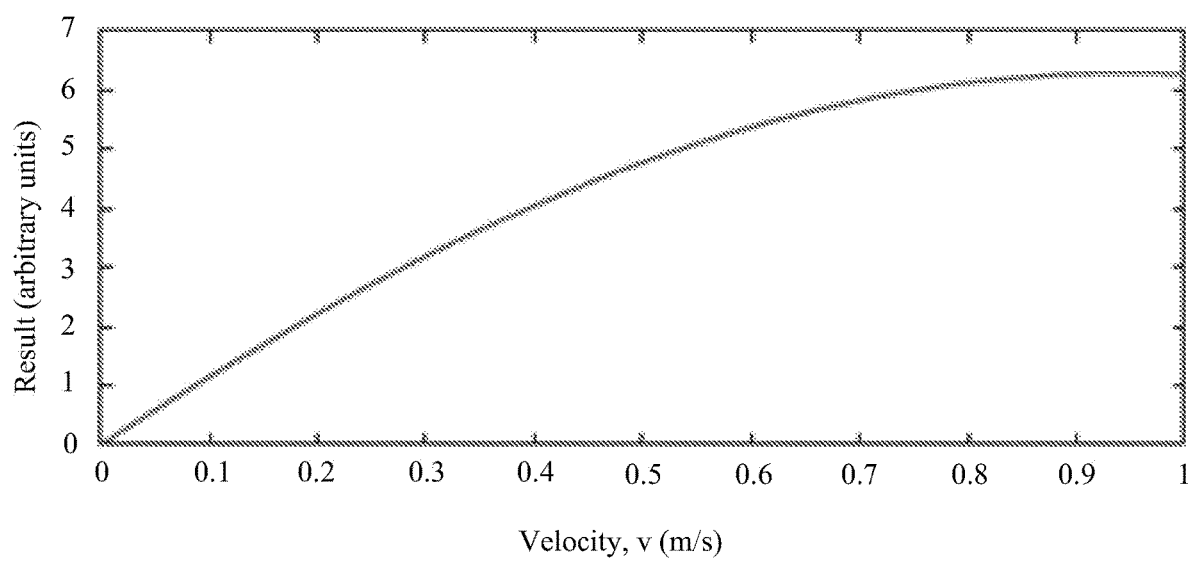
FIG. 9 is a table showing an example correspondence between a DC value output from the integration circuit described with reference to FIG. 8B and an instantaneous velocity of an object or medium.

FIG. 9 is a table showing an example correspondence between Result and instantaneous velocity, v, given various known or computed values for $\omega_0$, $\omega_m$, $\omega_{LO}$, $\Delta\omega$, T, $\phi_{LO}$, $\tau$, and c.

Assuming that $\phi_{LO}=0$, and without any loss of generality:

$$\frac{1}{\text{Result}} \propto \frac{\omega_m - \omega_{LO} + 2\omega_0 v/c - \Delta\omega\omega_m\tau\sin(\omega_m t)}{\sin(\omega_0 vT/c + \Delta\omega t)\cos(2\omega_0 vT/c)}$$

The above equation has two unknowns, v and $\tau$. To solve for the two unknowns v and $\tau$, two equations are needed. In some cases, the two equations can be based on the mean value and peak-to-peak value of $$\frac{1}{\text{Result}},$$

which are proportional to:

$$\text{mean}\left[\frac{1}{\text{Result}}\right] \propto \frac{\omega_m - \omega_{LO} - 2\omega_0 v/c}{\sin(\omega_0 vT/c + \Delta\omega T)\cos(2\omega_0 vT/c)}, \text{ and}$$

$$\text{peak-to-peak}\left[\frac{1}{\text{Result}}\right] \propto \frac{2\Delta\omega\omega_0\tau}{\sin(\omega_0 vT/c + \Delta\omega T)\cos(2\omega_0 vT/c)}$$

The peak-to-peak value of the Result signal may be obtained by strategically sampling the Result signal based on its known frequency and phase.

The above equations for the mean and peak-to-peak values of Result can be solved (e.g., by a processor, such as the processor described with reference to FIG. 14) to determine values for the instantaneous velocity, v, and round-trip propagation time, τ of emitted electromagnetic radiation. The round-trip propagation time may be used to determine the distance, d, between the self-mixing interferometry sensor 802 and the object or medium:

$$d = \frac{\tau c}{2}$$

In alternative embodiments, v, τ, and/or d may be determined using other parameters of Result, such as a root-mean-square (RMS) value of the output of the integrator circuit; a standard deviation of the output of the integrator circuit; or a higher order moment of the output of the integrator circuit.

Figure 10:
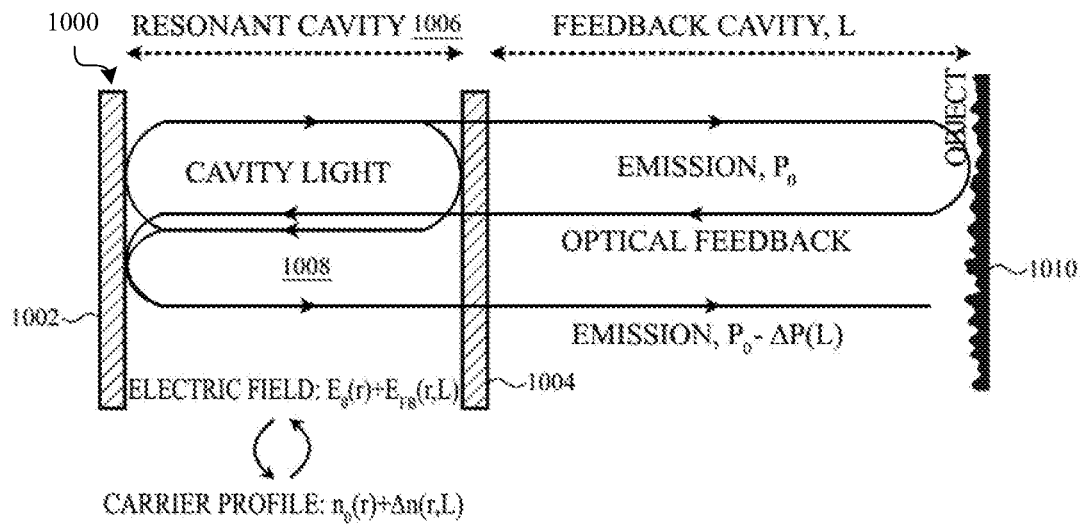
FIGS. 10, 11A, and 11B illustrate how coherent mixing of electromagnetic radiation within a resonant optical cavity of an electromagnetic radiation source alters (modulates) the power of a beam of electromagnetic radiation emitted by the electromagnetic radiation source, thereby providing a self-mixing interferometry signal.
Figure 11A:
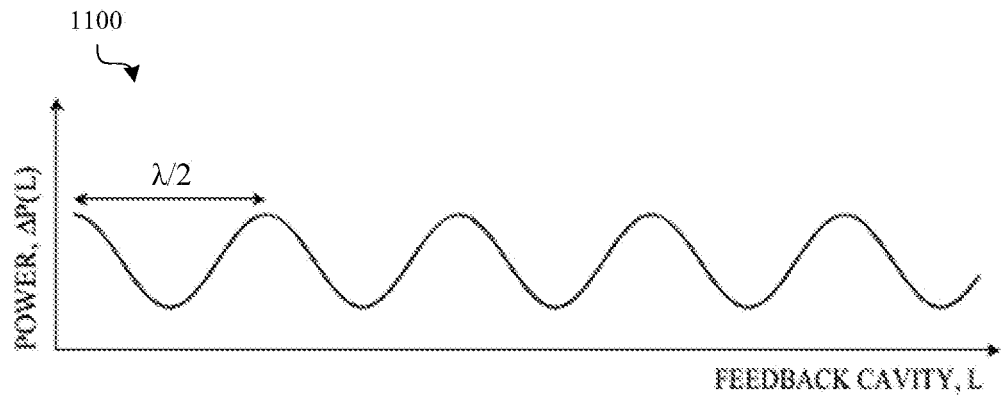
Figure 11B:
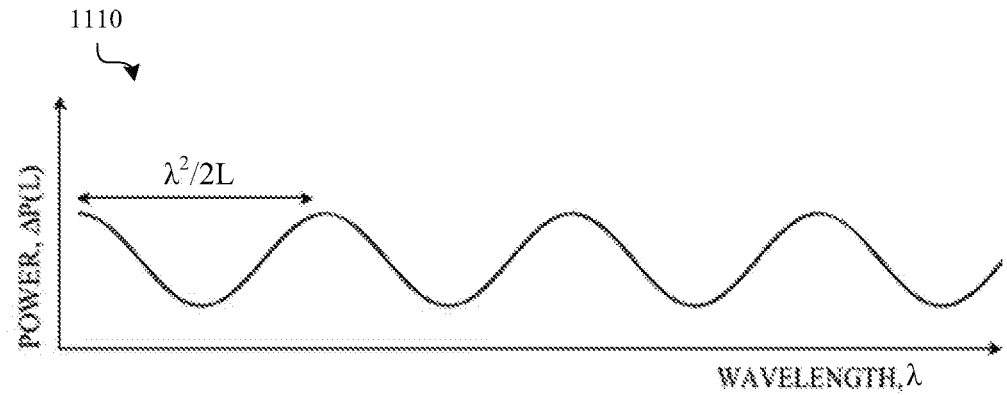

FIGS. 10, 11A, and 11B illustrate how coherent mixing of electromagnetic radiation within a resonant optical cavity of an electromagnetic radiation source alters (modulates) the power of a beam of electromagnetic radiation emitted by the electromagnetic radiation source, thereby providing a self-mixing interferometry signal.

As shown in FIG. 10, an electromagnetic radiation source 1000 may include a first mirror 1002 and a second mirror 1004 defining opposite ends of a resonant optical cavity 1006. Each mirror may include a plurality of layers of material defining a distributed Bragg reflector (e.g., a set of layers having alternating high and low refractive indices). Electromagnetic radiation generated by the electromagnetic radiation source 1000 reflects between the mirrors 1002, 1004 and is amplified as it passes through an optical gain material 1008 (a quantum well) between the mirrors 1002, 1004. The gain material may include multiple doped layers of III-V semiconductors (i.e., layers from the third row of the periodic table, and layers from the fifth row of the periodic table). In one example, the gain material may include aluminum-gallium-arsenide (AlGaAs), indium-gallium-arsenide (InGaAs), or gallium-arsenide (GaAs).

The electromagnetic radiation within the resonant optical cavity 1006 is: coherent (i.e., all photons in the electromagnetic radiation have a same frequency (i.e., same wavelength, λ) and phase), has an electric field $E_0(r)$, and is associated with a carrier profile $n_0 (r)$. The resonant optical cavity 1006 may be pumped electrically, by applying a voltage across the resonant optical cavity 1006 (e.g., to electrodes formed on each mirror, outside the resonant optical cavity 1006), or optically, by receiving electromagnetic radiation into the resonant optical cavity 1006. The second mirror 1004 may have a reflectivity of less than 100% (e.g., 99.9%), such that a portion of the electromagnetic radiation amplified by the optical gain material 1008 may escape the resonant optical cavity 1006 through the second mirror 1004 (e.g., into free space). The escaping electromagnetic radiation may have an emission power (i.e., an optical power) of $P_0$.

As shown in FIG. 10, the electromagnetic radiation emitted by the electromagnetic radiation source 1000 may reflect or scatter from an object or medium 1010 that is temporarily positioned at a nominal distance, L, from the second mirror 1004. Some of the reflected or scattered electromagnetic radiation may re-enter the resonant optical cavity 1006 as optical feedback. The feedback carries information about the object or medium 1010. The electromagnetic radiation that re-enters the resonant optical cavity 1006 mixes with the electromagnetic radiation generated by the electromagnetic radiation source 1000 coherently, to modify both the electromagnetic field within the resonant optical cavity 1006 and the electromagnetic radiation emitted by the electromagnetic radiation source 1000. The modified electromagnetic radiation within the resonant optical cavity 1006 has an electric field, $E_0(r)+E_{f_B}(r,L)$, and is associated with a carrier profile, $n_0 (r)+\Delta n(r,L)$. A portion of the electromagnetic radiation that mixes within the resonant optical cavity 1006 may escape the resonant optical cavity 1006 through the second mirror 1004, into free space, and has an emission power of $P_0-\Delta P(L)$. The nominal distance to the object or medium, L, can be considered a length of a feedback cavity, such that the resonant optical cavity 1006 and the feedback cavity represent arms (or branches) of an interferometer, and the power of the beam of electromagnetic radiation emitted by the electromagnetic radiation source 1000 is a self-mixing interferometry signal.

Electromagnetic radiation feedback also changes the emission frequency (or wavelength) of the electromagnetic radiation source 1000, due to a modification of the resonant optical cavity resonance condition in the presence of the feedback cavity. In some embodiments, this wavelength change can be used to detect the self-mixing interferometry signal (e.g., by means of using a Mach-Zender interferometer).

With continued reference to the electromagnetic radiation source 1000 described with reference to FIG. 10, FIG. 11A shows a graph 1100 of the variation in power, ΔP(L), within the resonant optical cavity 1006 of the electromagnetic radiation source 1000, as a function of the length, L, of the feedback cavity, in the presence of weak optical feedback. The graph 1100 depicts a predominantly sinusoidal variation with a period of λ/2. Theoretical considerations imply that the variation is given by the proportionality relationship: ΔP∝ cos(4πL/λ). This relationship generally holds in the absence of a strong specular reflection. FIG. 11B shows a graph 1110 of the variation in power, ΔP(L), within the resonant optical cavity 1006 of the electromagnetic radiation source 1000, as a function of a number of wavelengths of coherent electromagnetic radiation, λ, that define the length, L, of the feedback cavity. The graph 1110 depicts a predominantly sinusoidal variation with a period of $\lambda^2/2L$.

Figure 12A:
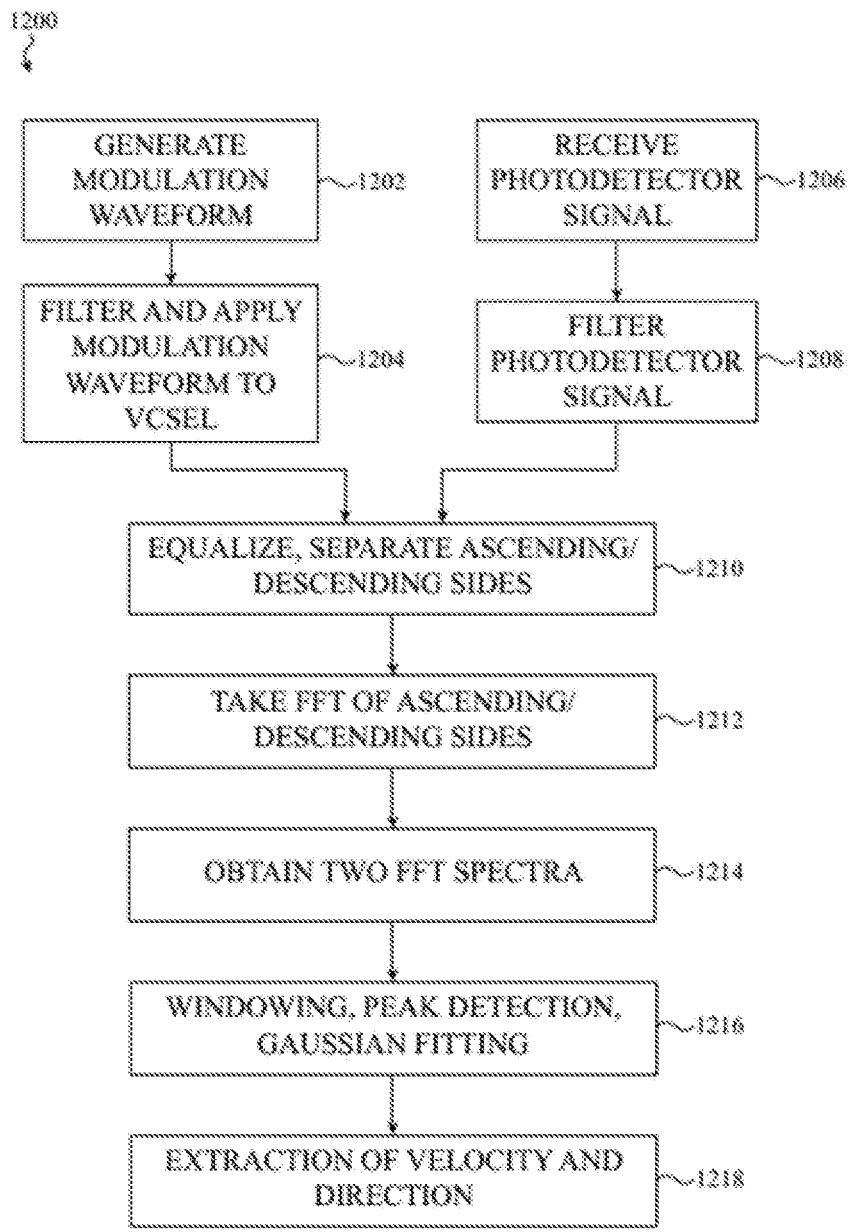
FIGS. 12A and 12B respectively show a flowchart of a method, and a block diagram of a system, which may be used to implement a spectrum analysis procedure that can be used as part of detecting objects or mediums and their proximity, distance, velocity, and direction of motion.
Figure 12B:
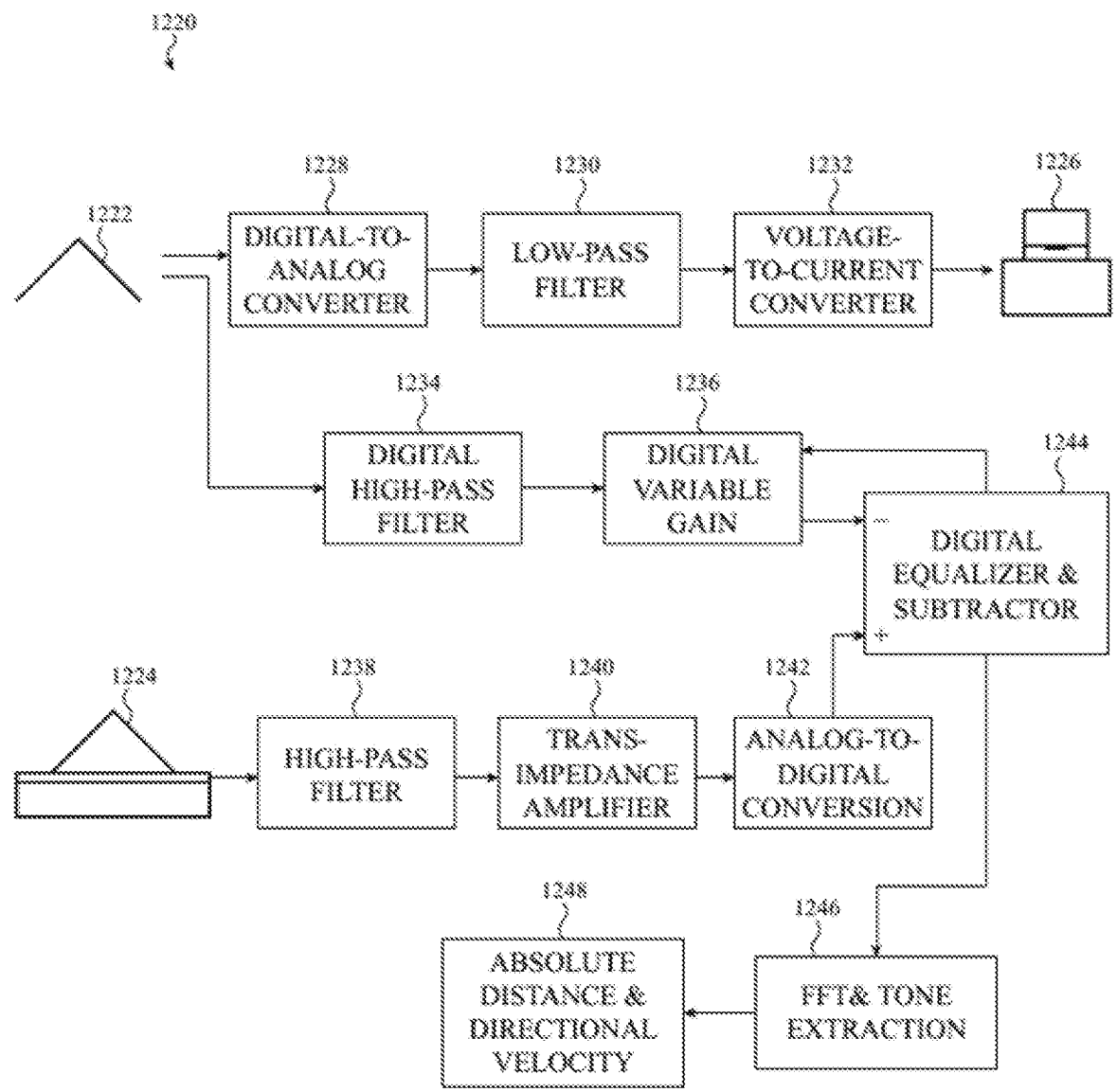

FIGS. 12A and 12B respectively show a flowchart of a method 1200, and a block diagram of a system 1220, which may be used to implement a spectrum analysis procedure that can be used as part of detecting objects or mediums and their proximity, distance, velocity, and direction of motion. The method 1200 and system 1220 may be used to drive or modulate an electromagnetic radiation source 1226, such as a VCSEL, VECSEL, QDL, QCL, or LED, with a modulation current 1222. The method 1200 and system 1220 may also analyze a signal 1224 related to an interferometric parameter. For purposes of explanation, it will be assumed that the modulation current 1222 is a triangular-shaped waveform. The modulation current 1222 may also have other shapes. The spectrum analysis method 1200 may concurrently analyze the modulation current 1222 and signal 1224 of the interferometric parameter. The modulation current 1222 and signal 1224 may be received at respective receiving circuits. Such receiving circuits may be one or more of the blocks of the system 1220 shown in FIG. 12B and described below, or may be one or more dedicated processors such as a graphics processor, an ASIC, or an FPGA, or may include a programmed microcomputer, microcontroller, or microprocessor. Various stages of the method 1200 may be performed by separate such processors, or all stages by one (set of) processors.

At the initial stage 1202 of the method 1200, an initial signal is generated, such as by a digital or an analog signal generator. At stage 1204, the generated initial signal may be processed as needed to produce the triangular waveform modulation current 1222 that is applied to the electromagnetic radiation source 1226. Stage 1204 may include, as needed, operations of a digital-to-analog conversion (DAC) (such as when the initial signal is an output of a digital step generator), low-pass filtering (such as to remove quantization noise from the DAC), and voltage-to-current conversion.

The application of the modulation current 1222 to the electromagnetic radiation source 1226 induces a signal 1224 in the interferometric property. It will be assumed for simplicity of discussion that the signal 1224 of the interferometric property is from a photodetector, but in other embodiments it may be another signal of an interferometric property from another component. At initial stage 1206 of the method 1200, the signal 1224 may be received. At stage 1208, initial processing of the signal 1224 may be performed as needed. Stage 1208 may include high-pass filtering.

At stage 1210, the processor may equalize the amplitudes of the received signals, if necessary. For example the signal 1224 may comprise a predominant triangle waveform component matching the modulation current 1222, with a smaller or larger amplitude, depending on the properties of the electromagnetic radiation source's associated driver and photodetector circuits. High-pass filtering may be applied to the signal 1224 to obtain the component signal related to the interferometric property. Also, this stage may involve separating the parts of signal 1224 and the modulation current 1222 corresponding to the ascending and descending time intervals of the modulation current 1222. This stage may include sampling the separated information.

At stages 1212 and 1214, a separate FFT may be performed on the parts of the processed signal 1224 corresponding to the ascending and to the descending time intervals, and the two FFT spectra may be analyzed.

At stage 1216, further processing of the FFT spectra can be performed, such as to remove artifacts and reduce noise. Such further processing can include windowing, peak detection, and Gaussian or parabolic fitting.

At stage 1218, and from the processed FFT spectra data, information regarding an object or medium can be obtained, including the distance to, and velocity of, the object or medium. A velocity of the object or medium may be inferred from the average of corresponding peaks (such as a fundamental beat), the distance from the difference of the peaks, and the direction of travel from the larger of the peaks.

FIG. 12B shows a block diagram of a system 1220 that can implement the spectrum analysis described in the method 1200. The exemplary system 1220 may generate an initial digital signal and process it as needed to produce a modulation current 1222 as an input to the electromagnetic radiation source 1226. In an illustrative example, an initial step signal may be produced by a digital generator to approximate a triangle function. The digital output values of the digital generator may be used in the digital-to-analog (DAC) converter 1228. The resulting voltage signal may then be filtered by the low-pass filter 1230 to remove quantization noise. Alternatively, an analog signal generator can be used to generate an equivalent voltage signal directly. The filtered voltage signal is then input to a voltage-to-current converter 1232 to produce the desired modulation current 1222 in a form for input to the electromagnetic radiation source 1226.

As described above, the presence or movement of an object or medium can cause changes in an interferometric parameter, such as a parameter of the electromagnetic radiation source 1226 or a photodetector that is associated with the electromagnetic radiation source 1226. The changes can be measured to produce a signal 1224. In the embodiment shown it will be assumed the signal 1224 is measured by a photodetector. For the modulation current 1222 having the triangular waveform shown, the signal 1224 may be a triangle wave of similar period combined with a smaller and higher frequency signal related to the interferometric property.

The signal 1224 may be passed into the high-pass filter 1238, which can effectively convert the major ascending and descending ramp components of the signal 1224 to DC offsets. As the signal 1224 from a photodetector (or the electromagnetic radiation source 1226 in other embodiments) may typically be a current signal, the transimpedance amplifier 1240 may produce a corresponding voltage output (with or without amplification) for further processing.

The voltage output can then be sampled and quantized by the analog-to-digital conversion (ADC) block 1242. Before immediately applying a digital FFT to the output of the ADC block 1242, it can be helpful to apply equalization. The initial digital signal values from the digital generator used to produce the modulation current 1222 are used as input to the digital high pass filter 1234 to produce a digital signal to correlate with the output of the ADC block 1242. An adjustable gain can be applied by the digital variable gain block 1236 to the output of the digital high pass filter 1234.

The output of the digital variable gain block 1236 may be used as one input to the digital equalizer and subtractor block 1244. The other input to the digital equalizer and subtractor block 1244 is the output of the ADC block 1242. The two signals are differenced, and used as part of a feedback to adjust the gain provided by the digital variable gain block 1236.

Once an optimal correlation is obtained by the feedback, an FFT, indicated by block 1246, can then be applied to the components of the output of the ADC block 1242 corresponding to the rising and descending of the triangle wave. From the FFT spectra obtained, absolute distance or movement of the object (e.g., directional velocity) can be determined or inferred, as discussed above and indicated by block 1248.

Figure 13:
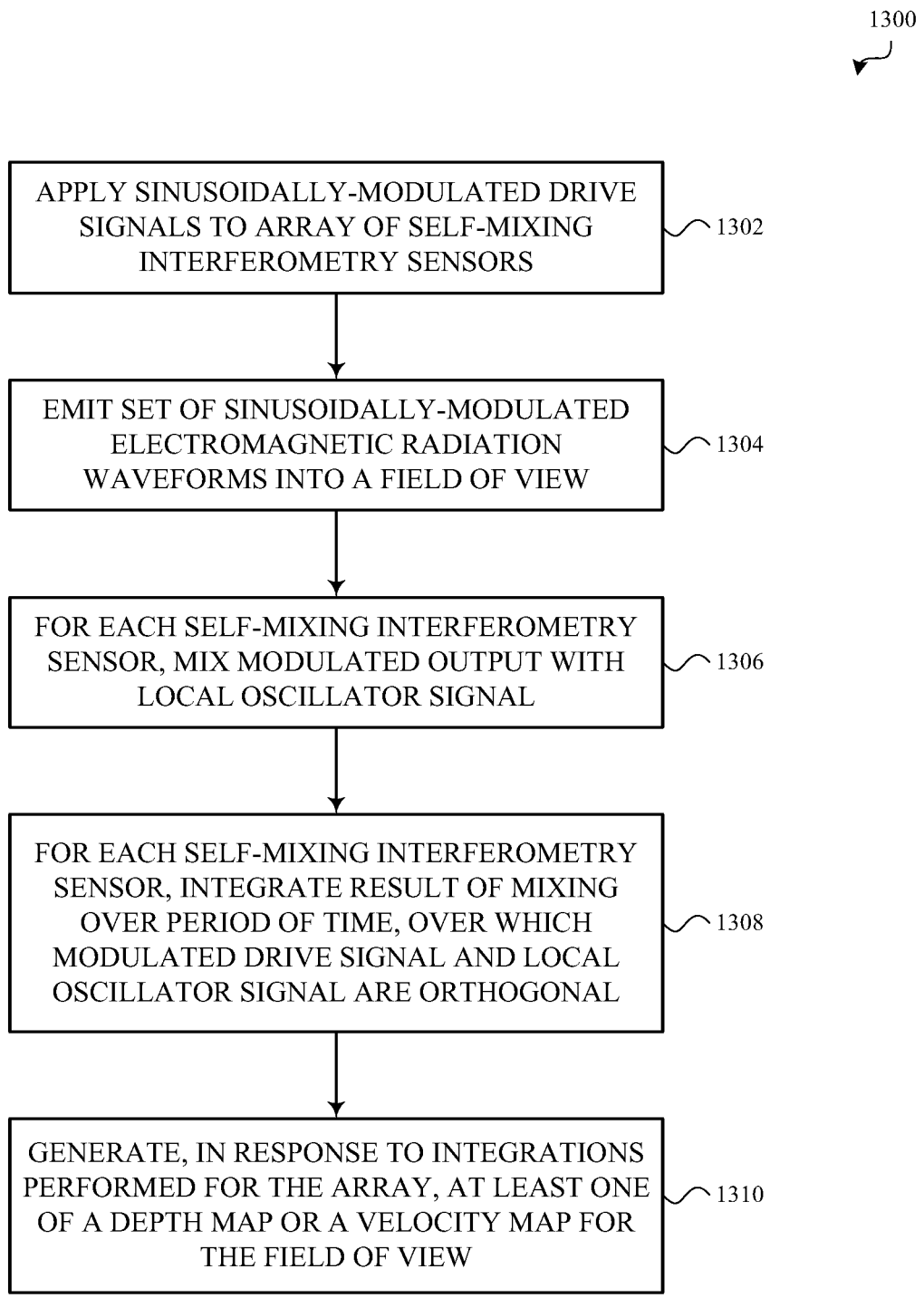
FIG. 13 shows a flowchart of a method of mapping (e.g., depth mapping or velocity mapping) a field of view.

FIG. 13 shows a flowchart of a method 1300 of mapping (e.g., depth mapping or velocity mapping) a FoV. The method 1300 may be performed by one or more of the sensor systems described herein (or other sensor systems).

At block 1302, the method 1300 may include applying sinusoidally-modulated drive signals to an array of self-mixing interferometry sensors, as described with reference to FIGS. 8A and 8B. The same sinusoidally-modulated drive signal may be applied to each of the self-mixing interferometry sensors in the array, and may have a somewhat arbitrarily chosen angular frequency, $\omega_m$, such that:

$$\omega_m \gg \frac{2v_{max}}{c}\omega_0 + \Delta\omega\omega_m\tau_{max}$$

At block 1304, the method 1300 may include emitting into the FoV from the array of self-mixing interferometry sensors, in response to the sinusoidally-modulated drive signals, a set of sinusoidally-modulated electromagnetic radiation waveforms, as described with reference to FIGS. 8A and 8B.

At blocks 1306 and 1308, and for each self-mixing interferometry sensor, the method 1300 may include mixing a modulated output of the self-mixing interferometry sensor with a local oscillator signal applied to the self-mixing interferometry sensor, and integrating a result of the mixing over a period of time, over which the modulated drive signal local oscillator signal are orthogonal, as described with reference to FIGS. 8A and 8B.

At block 1310, the method 1300 may include generating, in response to the integrations performed for the array of self-mixing interferometry sensors, at least one of a depth map or a velocity map for the FoV, as described with reference to FIGS. 8A and 8B.

In some embodiments, a depth map may be generated for a bio-authentication sensor system. In other embodiments, a depth map and/or velocity map may be generated for a gesture sensor.

Figure 14:
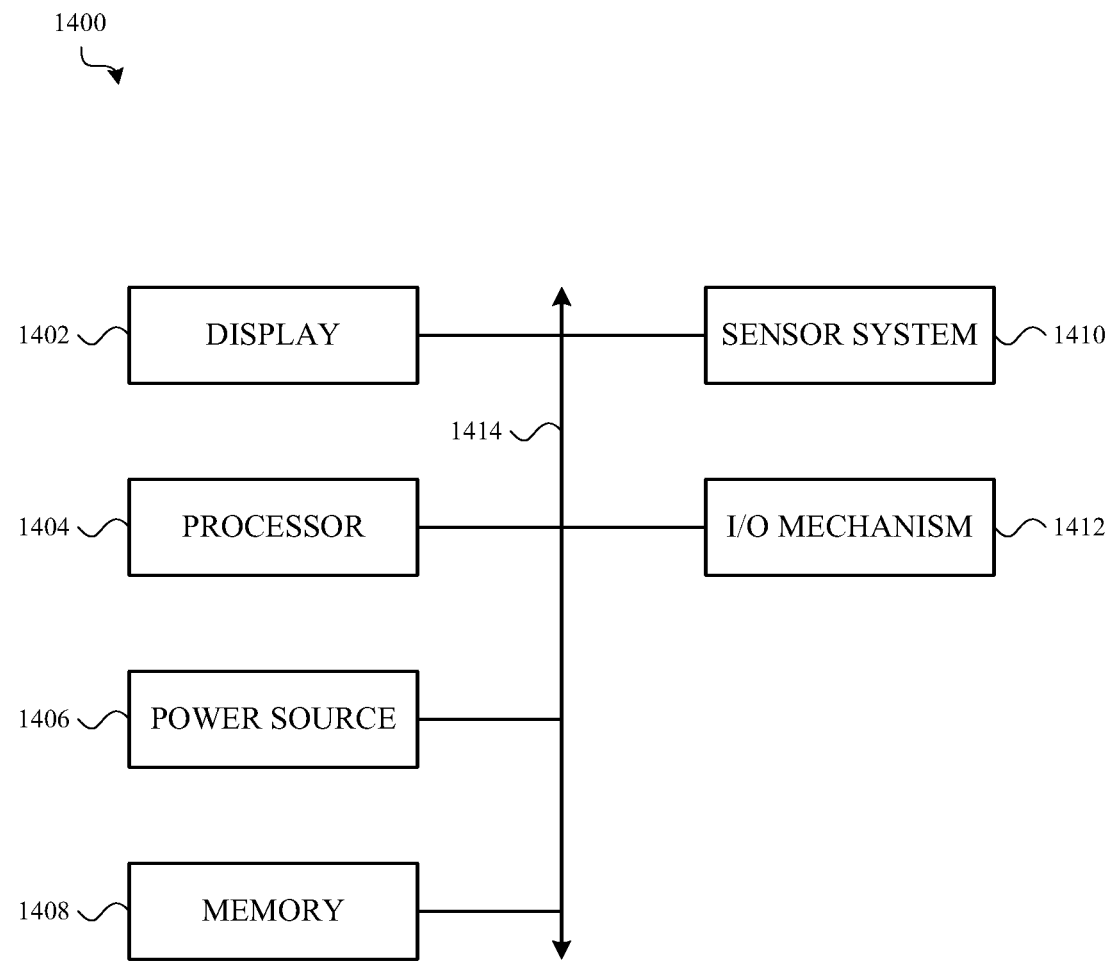
FIG. 14 shows an example electrical block diagram of an electronic device.

FIG. 14 shows a sample electrical block diagram of an electronic device 1400, which electronic device may in some cases take the form of the device described with reference to FIGS. 1A-1B or FIGS. 2A-2B and/or include a sensor system as described with reference to any of FIGS. 1A-8B and 10-13. The electronic device 1400 may include a display 1402 (e.g., a light-emitting display), a processor 1404, a power source 1406, a memory 1408 or storage device, a sensor system 1410, or an input/output (I/O) mechanism 1412 (e.g., an input/output device, input/output port, or haptic input/output interface). The processor 1404 may control some or all of the operations of the electronic device 1400. The processor 1404 may communicate, either directly or indirectly, with some or all of the other components of the electronic device 1400. For example, a system bus or other communication mechanism 1414 can provide communication between the display 1402, the processor 1404, the power source 1406, the memory 1408, the sensor system 1410, and the I/O mechanism 1412.

The processor 1404 may be implemented as any electronic device capable of processing, receiving, or transmitting data or instructions, whether such data or instructions is in the form of software or firmware or otherwise encoded. For example, the processor 1404 may include a microprocessor, a central processing unit (CPU), an application-specific integrated circuit (ASIC), a digital signal processor (DSP), a controller, or a combination of such devices. As described herein, the term "processor" is meant to encompass a single processor or processing unit, multiple processors, multiple processing units, or other suitably configured computing element or elements.

It should be noted that the components of the electronic device 1400 can be controlled by multiple processors. For example, select components of the electronic device 1400 (e.g., the sensor system 1410) may be controlled by a first processor and other components of the electronic device 1400 (e.g., the display 1402) may be controlled by a second processor, where the first and second processors may or may not be in communication with each other.

The power source 1406 can be implemented with any device capable of providing energy to the electronic device 1400. For example, the power source 1406 may include one or more batteries or rechargeable batteries. Additionally or alternatively, the power source 1406 may include a power connector or power cord that connects the electronic device 1400 to another power source, such as a wall outlet.

The memory 1408 may store electronic data that can be used by the electronic device 1400. For example, the memory 1408 may store electrical data or content such as, for example, audio and video files, documents and applications, device settings and user preferences, timing signals, control signals, and data structures or databases. The memory 1408 may include any type of memory. By way of example only, the memory 1408 may include random access memory, read-only memory, Flash memory, removable memory, other types of storage elements, or combinations of such memory types.

The electronic device 1400 may also include one or more sensor systems 1410 positioned almost anywhere on the electronic device 1400. In some cases, sensor systems 1410 may be positioned as described with reference to FIGS. 1A-1B, or FIGS. 2A-2B. The sensor system(s) 1410 may be configured to sense one or more type of parameters, such as but not limited to, light; touch; force; heat; movement; relative motion; biometric data (e.g., biological parameters) of a user; air quality; proximity; position; connectedness; and so on. By way of example, the sensor system(s) 1410 may include a heat sensor, a position sensor, a light or optical sensor, an accelerometer, a pressure transducer, a gyroscope, a magnetometer, a health monitoring sensor, and an air quality sensor, and so on. Additionally, the one or more sensor systems 1410 may utilize any suitable sensing technology, including, but not limited to, magnetic, capacitive, ultrasonic, resistive, optical, acoustic, piezoelectric, or thermal technologies.

The I/O mechanism 1412 may transmit or receive data from a user or another electronic device. The I/O mechanism 1412 may include the display 1402, a touch sensing input surface, a crown, one or more buttons (e.g., a graphical user interface "home" button), one or more cameras (including an under-display camera), one or more microphones or speakers, one or more ports such as a microphone port, and/or a keyboard. Additionally or alternatively, the I/O mechanism 1412 may transmit electronic signals via a communications interface, such as a wireless, wired, and/or optical communications interface. Examples of wireless and wired communications interfaces include, but are not limited to, cellular and Wi-Fi communications interfaces.

The foregoing description, for purposes of explanation, uses specific nomenclature to provide a thorough understanding of the described embodiments. However, it will be apparent to one skilled in the art, after reading this description, that the specific details are not required in order to practice the described embodiments. Thus, the foregoing descriptions of the specific embodiments described herein are presented for purposes of illustration and description. They are not targeted to be exhaustive or to limit the embodiments to the precise forms disclosed. It will be apparent to one of ordinary skill in the art, after reading this description, that many modifications and variations are possible in view of the above teachings.

What is claimed is:

1. A sensor system, comprising:
   a self-mixing interferometry sensor;
   a drive circuit configured to apply a modulated drive signal to an input of the self-mixing interferometry sensor;
   a mixer circuit configured to mix a modulated output of the self-mixing interferometry sensor with a local oscillator signal that is orthogonal to the modulated drive signal over a period of time; and
   an integrator circuit configured to integrate an output of the mixer circuit over the period of time.

2. The sensor system of claim 1, further comprising:
   a processor configured to determine, using an output of the integrator circuit, at least one of:
   a round-trip propagation time of electromagnetic radiation emitted by the self-mixing interferometry sensor and reflected back into the self-mixing interferometry sensor by an object or medium; or
   a velocity of the object or medium.

3. The sensor system of claim 2, wherein the processor is further configured to determine, from the round-trip propagation time, a distance between the self-mixing interferometry sensor and the object or medium.

4. The sensor system of claim 2, wherein the processor is configured to:
   determine a mean value of the output of the integrator circuit;
   determine a peak-to-peak value in the output of the integrator circuit; and
   determine the round-trip propagation time of the electromagnetic radiation and the velocity of the object or medium using the mean value and the peak-to-peak value.

5. The sensor system of claim 2, wherein the processor is configured to determine at least two parameters of the output of the integrator circuit, including at least one of: a mean value of the output of the integrator circuit; a peak-to-peak value of the output of the integrator circuit; a root-mean-square (RMS) value of the output of the integrator circuit; a standard deviation of the output of the integrator circuit; or a higher order moment of the output of the integrator circuit.

6. The sensor system of claim 1, wherein:
   the input of the self-mixing interferometry sensor is a bias current input;
   the modulated output of the self-mixing interferometry sensor is a modulated photocurrent; and
   the sensor system further comprises a transimpedance amplifier configured to convert the modulated photocurrent to a modulated voltage provided to the mixer circuit.

7. The sensor system of claim 6, further comprising:
   a bandpass filter configured to filter the modulated voltage before the modulated voltage is provided to the mixer circuit.

8. The sensor system of claim 7, further comprising:
   a low-pass filter configured to filter the output of the mixer circuit before the output is provided to the integrator circuit.

9. The sensor system of claim 1, wherein the self-mixing interferometry sensor is a first self-mixing interferometry sensor, the sensor system further comprising:
   a second self-mixing interferometry sensor; wherein:
   the first self-mixing interferometry sensor and the second self-mixing interferometry sensor are individually addressable within an array of self-mixing interferometry sensors.

10. The sensor system of claim 1, further comprising:
    a set of one or more self-mixing interferometry sensors including the self-mixing interferometry sensor; and
    a set of one or more lenses defining a set of multiple electromagnetic radiation emission regions; wherein:
    the set of one or more self-mixing interferometry sensors outputs a set of sinusoidally-modulated electromagnetic radiation waveforms; and
    the set of one or more lenses directs different electromagnetic radiation waveforms into different electromagnetic radiation emission regions.

11. The sensor system of claim 10, wherein the set of multiple electromagnetic radiation emission regions comprises different spatial regions or angular regions.

12. The sensor system of claim 10, wherein:
    the set of one or more self-mixing interferometry sensors comprises a plurality of self-mixing interferometry sensors; and
    the set of one or more lenses comprises a lens positioned to receive electromagnetic radiation emitted by the plurality of self-mixing interferometry sensors and direct the electromagnetic radiation waveforms emitted by different self-mixing interferometry sensors into different electromagnetic radiation emission regions.

13. The sensor system of claim 10, wherein:
    the set of one or more self-mixing interferometry sensors comprises a plurality of self-mixing interferometry sensors; and
    the set of one or more lenses comprises multiple lenses, with different lenses positioned to receive electromagnetic radiation waveforms emitted by different self-mixing interferometry sensors.

14. The sensor system of claim 10, further comprising:
    a processor configured to generate a depth map for the different electromagnetic radiation emission regions; wherein:
    the processor generates the depth map in response to a set of modulated outputs of the set of one or more self-mixing interferometry sensors.

15. The sensor system of claim 10, further comprising:
    a processor configured to generate a velocity map for the different electromagnetic radiation emission regions; wherein:
    the processor generates the velocity map in response to a set of modulated outputs of the set of one or more self-mixing interferometry sensors.

16. The sensor system of claim 10, further comprising:
    circuitry comprising the drive circuit and configured to apply a set of modulated drive signals to inputs of the set of one or more self-mixing interferometry sensors.

17. The sensor system of claim 16, wherein the circuitry is further configured to:
    determine, using an output of the integrator, at least one of:
    a round-trip propagation time of electromagnetic radiation emitted by the self-mixing interferometry sensor and reflected back into the self-mixing interferometry sensor by an object or medium; or
    a velocity of the object or medium.

18. A method of mapping a field of view, comprising:
applying sinusoidally-modulated drive signals to an array of self-mixing interferometry sensors;
emitting into the field of view from the array of self-mixing interferometry sensors, in response to the sinusoidally-modulated drive signals, a set of sinusoidally-modulated electromagnetic radiation waveforms;
for each self-mixing interferometry sensor:
mixing a modulated output of the self-mixing interferometry sensor with a local oscillator signal that is orthogonal to the sinusoidally-modulated drive signals over a period of time; and
integrating a result of the mixing over the period of time; and
generating, in response to the integrations performed for the array of self-mixing interferometry sensors, at least one of a depth map or a velocity map for the field of view.

19. The method of claim 18, wherein the depth map is generated for a bio-authentication sensor system.

20. The method of claim 18, wherein the at least one of the depth map or the velocity map is generated for a gesture sensor.

* * * * *